(12) United States Patent
Yamasaki et al.

(10) Patent No.: US 10,629,263 B2
(45) Date of Patent: Apr. 21, 2020

(54) SEMICONDUCTOR MEMORY DEVICE

(71) Applicant: TOSHIBA MEMORY CORPORATION, Minato-ku, Tokyo (JP)

(72) Inventors: Takashi Yamasaki, Yokohama Kanagawa (JP); Shinichi Kikuchi, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/101,932

(22) Filed: Aug. 13, 2018

(65) Prior Publication Data

US 2019/0180819 A1    Jun. 13, 2019

(30) Foreign Application Priority Data

Dec. 12, 2017 (JP) ................................. 2017-238103

(51) Int. Cl.
| | |
|---|---|
| *G11C 14/00* | (2006.01) |
| *G11C 7/04* | (2006.01) |
| *G11C 5/04* | (2006.01) |
| *G11C 5/14* | (2006.01) |
| *G11C 11/4063* | (2006.01) |

(Continued)

(52) U.S. Cl.
CPC .......... *G11C 14/0018* (2013.01); *G11C 5/04* (2013.01); *G11C 5/141* (2013.01); *G11C 7/04* (2013.01); *G11C 16/0483* (2013.01); *G11C 11/4063* (2013.01); *G11C 16/0475* (2013.01); *H01L 27/108* (2013.01); *H01L 27/112* (2013.01)

(58) Field of Classification Search
CPC ....... G11C 14/0018; G11C 5/04; G11C 5/141; G11C 7/04; G11C 11/4063; H01L 27/112; H01L 27/108; H01L 27/11206
See application file for complete search history.

(56) References Cited

U.S. PATENT DOCUMENTS

| | | | |
|---|---|---|---|
| 2010/0232124 A1 | 9/2010 | Bang et al. | |
| 2011/0063790 A1* | 3/2011 | Park | ..................... H05K 1/0239 361/679.31 |

(Continued)

FOREIGN PATENT DOCUMENTS

| | | | |
|---|---|---|---|
| JP | 2013120894 A | * | 6/2013 |
| JP | 2015-038643 A | | 2/2015 |

(Continued)

*Primary Examiner* — Fernando L Toledo
*Assistant Examiner* — Aaron J Gray
(74) *Attorney, Agent, or Firm* — Foley & Lardner LLP

(57) ABSTRACT

A semiconductor memory device includes a substrate, a controller, a semiconductor memory component, first and second capacitors, and a jumper element. The substrate has a conductor pattern. The conductor pattern includes a first conductor portion and a second conductor portion. The first conductor portion overlaps at least a part of the first capacitor in a thickness direction of the substrate and is electrically connected to the first capacitor. The second conductor portion overlaps at least a part of the second capacitor in the thickness direction of the substrate and is electrically connected to the second capacitor. The first conductor portion and the second conductor portion are separated from each other, and are electrically connected to each other by the jumper element.

12 Claims, 13 Drawing Sheets

(51) Int. Cl.
*H01L 27/108* (2006.01)
*H01L 27/112* (2006.01)
*G11C 16/04* (2006.01)

(56) References Cited

U.S. PATENT DOCUMENTS

2016/0049177 A1\* 2/2016 Shiozawa ............... G11C 5/141
  365/226
2016/0254031 A1\* 9/2016 Noguchi ................. G11C 5/02
  365/185.08
2017/0315873 A1\* 11/2017 Alcorn ................... G11C 5/141
2018/0308527 A1\* 10/2018 Narayanan ............. G11C 5/141

FOREIGN PATENT DOCUMENTS

JP            5791872 B2   8/2015
JP            2017-084066 A   5/2017

\* cited by examiner

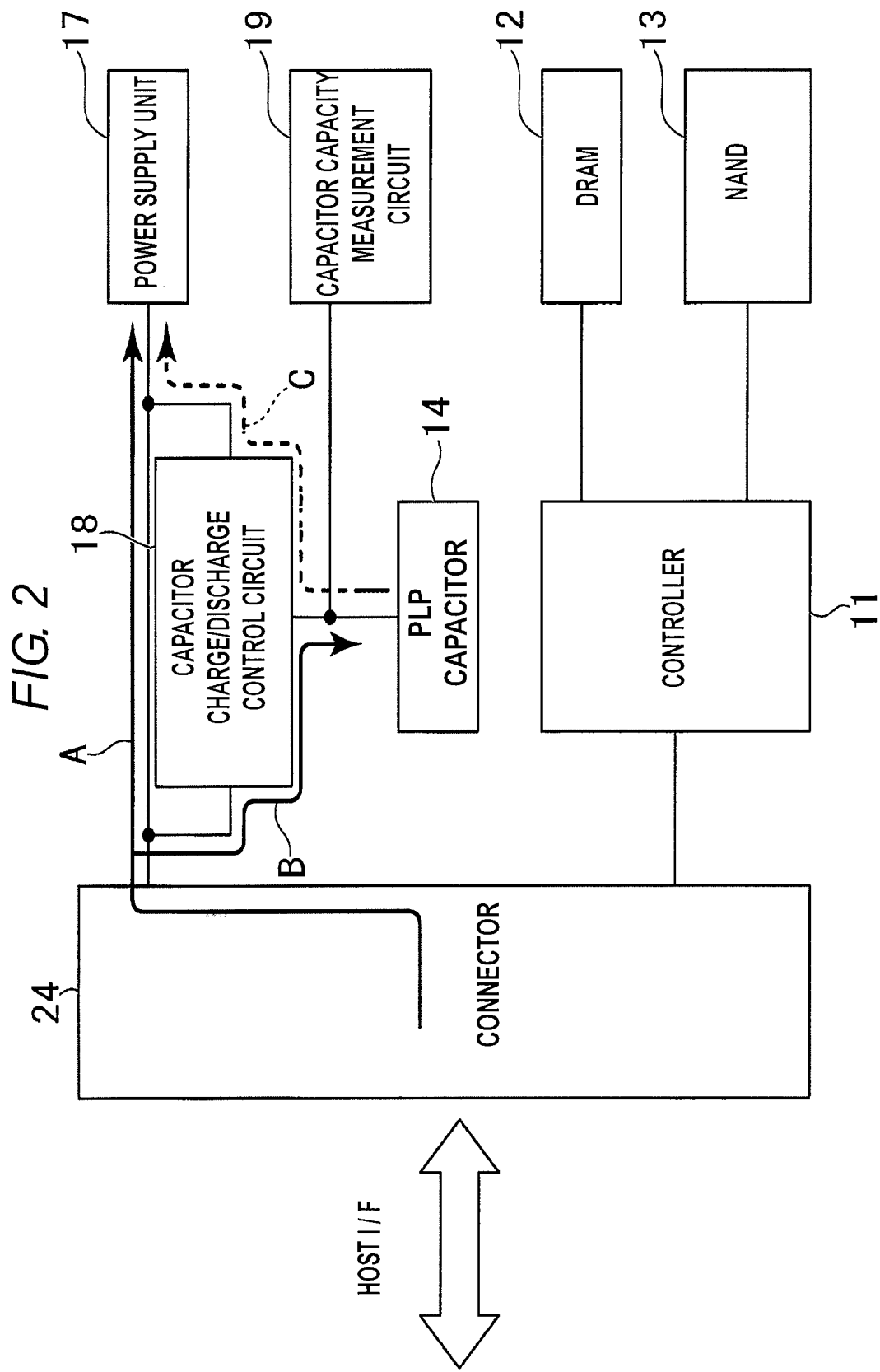

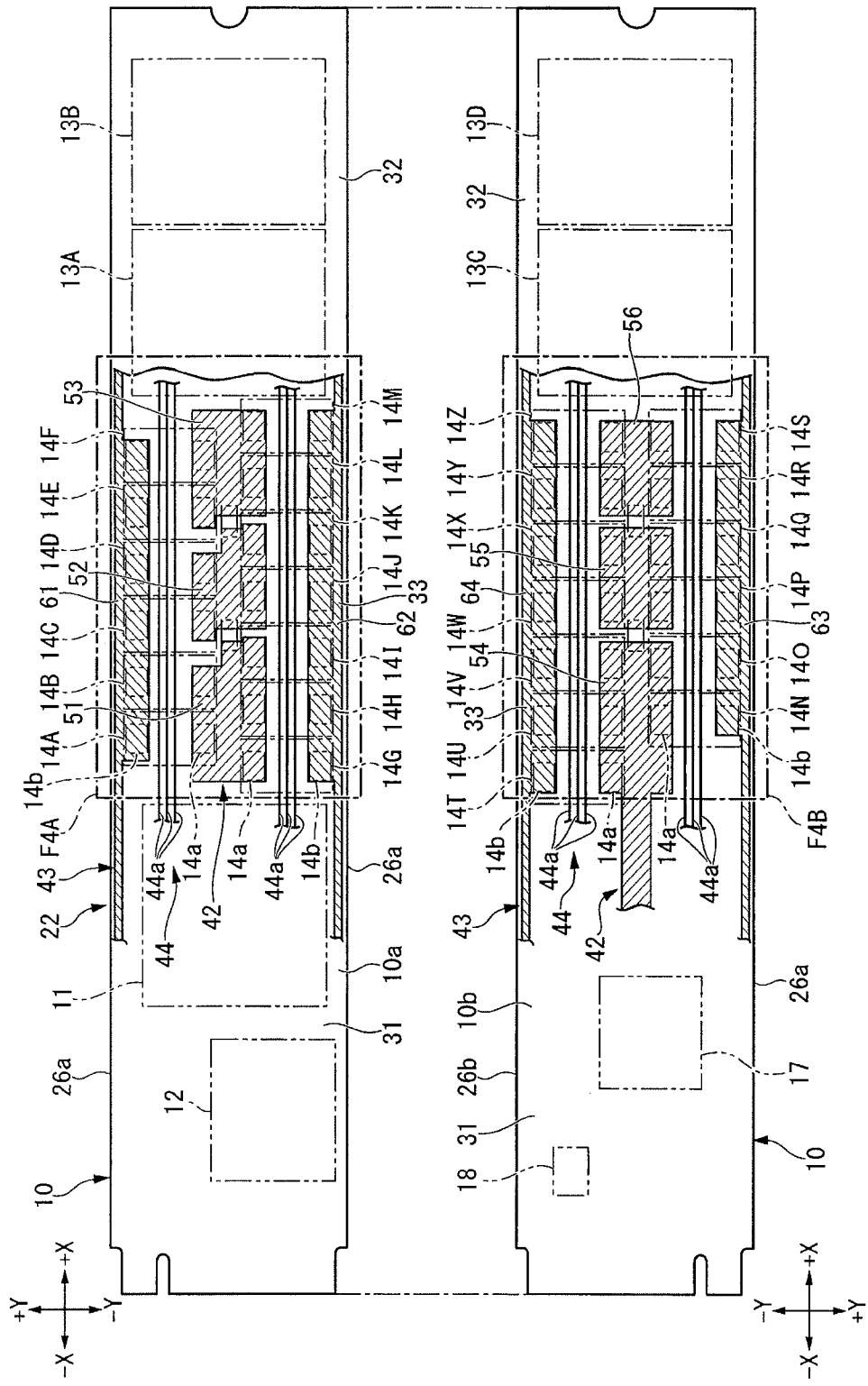

SEMICONDUCTOR MEMORY DEVICE

CROSS-REFERENCE TO RELATED APPLICATION

This application claims the benefit of priority to Japanese Patent Application No. 2017-238103, filed, Dec. 12, 2017; the entire contents of which are incorporated herein by reference.

FIELD

Embodiments described herein relate generally to a semiconductor memory device.

BACKGROUND

A known semiconductor storage device includes a substrate, a controller, and a semiconductor memory component.

DESCRIPTION OF THE DRAWINGS

FIG. 2 is a block diagram illustrating a part of a functional configuration of the semiconductor memory device according to the first embodiment.

FIG. 3 is a view illustrating a part of a conductor pattern of the semiconductor memory device according to the first embodiment.

DETAILED DESCRIPTION

Figure 1:
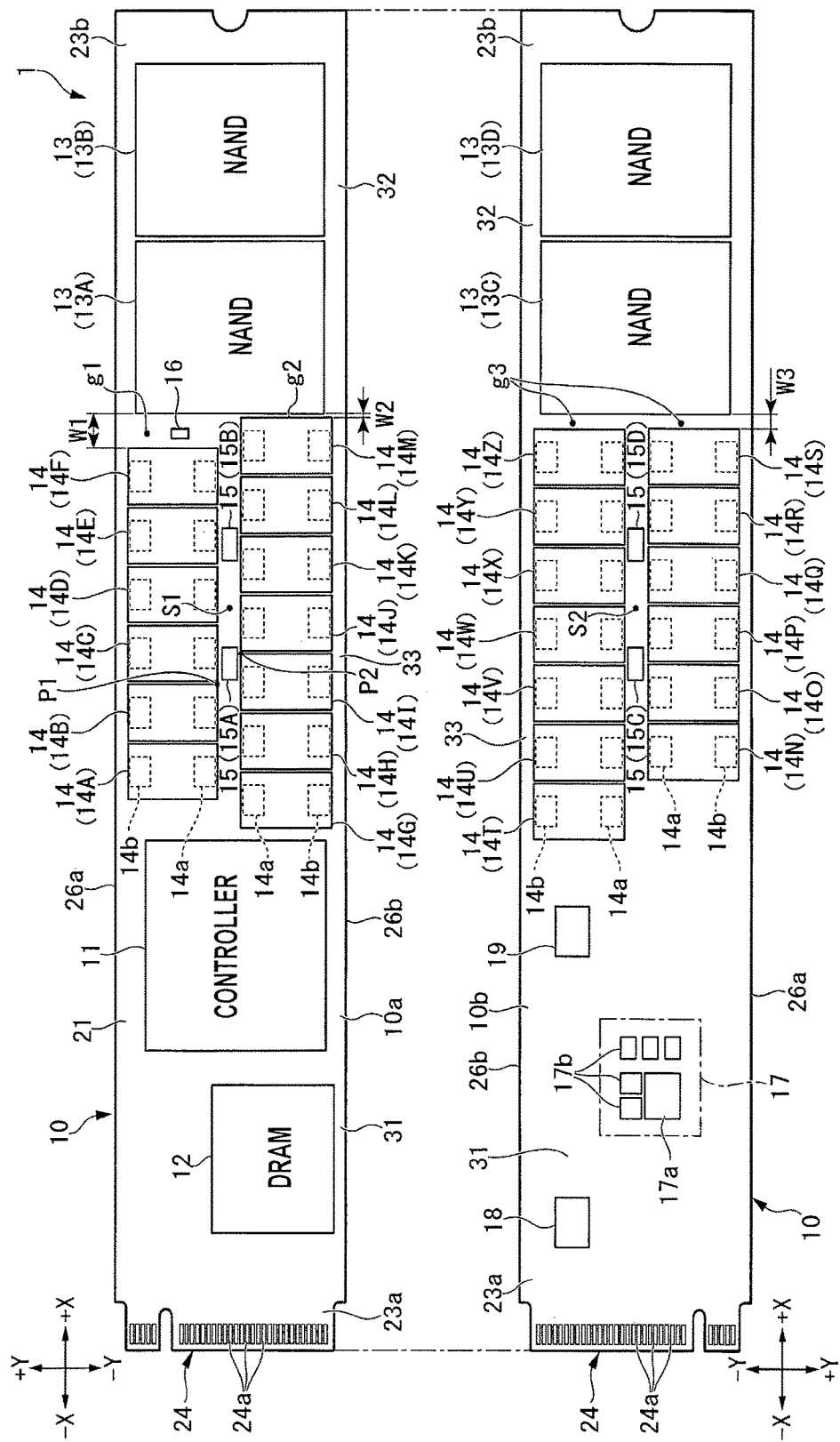
FIG. 1 is a view illustrating a semiconductor memory device according to a first embodiment.

An embodiment provides a semiconductor memory device whose reliability can be improved.

In general, according to one embodiment, the semiconductor memory device may include a substrate, a controller, a semiconductor memory component, first and second capacitors, and a jumper element. The substrate may have a first region, a second region, and a third region located between the first region and the second region, and have a conductor pattern. The controller may be mounted in the first region. The semiconductor memory component may be mounted in the second region, and controlled by the controller. The first and second capacitors may be mounted in the third region, and aligned in a first direction from the first region toward the second region. The jumper element may be mounted in the third region. The conductor pattern may include a first conductor portion that overlaps at least a part of the first capacitor in a thickness direction of the substrate and is electrically connected to the first capacitor, and a second conductor portion that overlaps at least a part of the second capacitor in the thickness direction of the substrate and is electrically connected to the second capacitor. The first conductor portion and the second conductor portion may be separated from each other in the first direction, and may be electrically connected to each other by the jumper element.

Hereinafter, a semiconductor memory device according to some embodiments will be described with reference to drawings. In the following description, components having the same or similar functions are denoted by the same reference numerals. Then, duplicate descriptions for these components may be omitted.

Here, meanings of some terms used in the present application will be described first. The term "aligned" in the present application is not limited to a case where two objects are aligned such that their central portions face each other, but also includes a case where two objects are aligned such that their portions face each other (that is, they face each other in the state of being shifted from each other). The term "aligned" also includes a case where the objects are aligned to be spaced apart from each other. The phrase "overlapping in the thickness direction of a substrate" means that virtual projection images of two objects overlap each other when viewed along the thickness direction of the substrate, and also includes a case where the two objects are not in direct contact with each other. The term "overlapping" also includes a case of at least partial overlapping.

First, +X direction, −X direction, +Y direction, −Y direction, +Z direction, and −Z direction will be defined. The +X direction, the −X direction, the +Y direction, and the −Y direction are directions along a first surface 10a of a substrate 10 (see FIG. 1) to be described below. As illustrated in FIG. 1, the +X direction is a direction from a first region 31 toward a second region 32 of the substrate 10, and is, for example, a longitudinal direction of the substrate 10 in a rectangular shape. The +X direction is an example of a "first direction." The −X direction is a direction opposite to the +X direction. The +X direction and the −X direction are simply referred to as "X direction" when not distinguished from each other. The +Y direction and the −Y direction are directions intersecting (for example, substantially perpendicular to) the X direction, and are, for example, width directions of the substrate 10. The +Y direction is a direction from a central portion of the substrate 10 toward one side portion 26a of the substrate 10. The +Y direction is an example of the "second direction." The −Y direction is a direction opposite to the +Y direction. The +Y direction and the −Y direction are simply referred to as "Y direction" when not distinguished from each other. The +Z direction and the −Z direction are directions intersecting (for example, substantially perpendicular to) the X direction and the Y direction, and are, for example, thickness directions of the substrate 10. The +Z direction is a direction from the second surface 10b toward the first surface 10a of the substrate 10. The −Z direction is a direction opposite to the +Z direction. The +Z direction and the −Z direction are simply referred as "Z direction" when not distinguished from each other.

First Embodiment

As illustrated in FIG. 1 to FIG. 7, a semiconductor memory device 1 according to the first embodiment will be described. The semiconductor memory device 1 may be a memory device such as, for example, a solid state drive (SSD). The semiconductor memory device 1 may be provided in an information processing apparatus such as, for example, a server apparatus or a personal computer, and is used as a storage device of the information processing apparatus. An apparatus that may use the semiconductor memory device 1 is not limited to the above described example. The semiconductor memory device 1 may be widely used in various information processing apparatuses. Hereinafter, the information processing apparatus in which the semiconductor memory device 1 is provided will be referred to as a "host apparatus."

FIG. 1 is a view illustrating the semiconductor memory device 1. The upper portion in FIG. 1 illustrates the front surface of the semiconductor memory device 1. The lower portion in FIG. 1 illustrates the back surface of the semiconductor memory device 1. The semiconductor memory device 1 includes, for example, the substrate 10, a controller 11, a dynamic random access memory (DRAM) 12, a plurality of NAND-type flash memories 13 (hereinafter, referred to as "NANDs 13"), a plurality of capacitors 14, a plurality of jumper elements 15, a temperature sensor 16, a power supply unit 17, a capacitor charge/discharge control circuit 18, and a capacitor capacity measurement circuit 19.

The substrate (e.g., a wiring board, a printed board) 10 includes an insulator 21, and a conductor pattern 22 (see FIG. 5) provided on the insulator 21. The substrate 10 is, for example, a multilayer substrate, but is not limited thereto.

The substrate 10 includes a first end portion 23a, and a second end portion 23b located opposite to the first end portion 23a. The first end portion 23a is an end portion at a −X direction side. The first end portion 23a includes a terminal portion 24 (e.g., a connector) to be inserted into a slot of the host apparatus. The terminal portion 24 includes a plurality of terminals 24a exposed on the surface of the substrate 10. When the terminal portion 24 is inserted into the slot of the host apparatus, the semiconductor memory device 1 can be electrically connected to the host apparatus. To the semiconductor memory device 1, power can be supplied from the host apparatus as an external power source. The semiconductor memory device 1 may perform writing, reading, erasing of data, based on various commands received from the host apparatus.

As illustrated in FIG. 1, the substrate 10 includes a first side portion 26a, and a second side portion 26b located opposite to the first side portion 26a. The first side portion 26a is a side portion extending in the X direction at an end portion of the substrate 10 at the +Y direction side. The second side portion 26b is a side portion extending in the X direction at an end portion of the substrate 10 at the −Y direction side.

The substrate 10 includes the first surface 10a and a second surface 10b located opposite to the first surface 10a. The first surface 10a and the second surface 10b may be surfaces on which various electronic components are mounted. The substrate 10 has first to third regions 31 to 33. Meanwhile, the first to third regions 31 to 33 may be regions on the same surface of the substrate 10. The first region 31 is a region closest to the first end portion 23a of the substrate 10, among the first to third regions 31 to 33. The second region 32 is a region closest to the second end portion 23b of the substrate 10, among the first to third regions 31 to 33. The third region 33 is a region located between the first region 31 and the second region 32 in the X direction.

The controller 11 may be mounted on, for example, the first surface 10a of the substrate 10, in the first region 31 of the substrate 10. The controller 11 may collectively control the whole of the semiconductor memory device 1. For example, the controller 11 may be configured as a System on a Chip (SoC) in which a host interface circuit for the host apparatus, a control circuit controlling the DRAM 12, a control circuit controlling the plurality of NANDs 13 and the like are integrated in one semiconductor chip.

The DRAM 12 is mounted on, for example, the first surface 10a of the substrate 10, in the first region 31 of the substrate 10. The DRAM 12 is an example of a volatile semiconductor memory chip. The DRAM 12 may serve as a data buffer that temporarily stores write target data received from the host apparatus, and read target data read from the NANDs 13.

The plurality of NANDs 13 are mounted in the second region 32 of the substrate 10. The NAND 13 is an example of a non-volatile semiconductor memory chip, and is an example of a "semiconductor memory component." The plurality of NANDs 13 include, for example, two NANDs 13A and 13B mounted on the first surface 10a of the substrate 10, and two NANDs 13C and 13D mounted on the second surface 10b of the substrate 10. In the first embodiment, the two NANDs 13A and 13B mounted on the first surface 10a are aligned in the X direction. The two NANDs 13C and 13D mounted on the second surface 10b are aligned in the X direction.

Here, a write operation of data in the semiconductor memory device 1 will be described. To store data in the semiconductor memory device 1, the controller 11 may temporarily store write target data received from the host apparatus, in the DRAM 12. Thereafter, the controller 11 may transmit the write target data from the DRAM 12 to the NANDs 13, so as to store the write target data in the NANDs 13. In the semiconductor memory device 1, the write speed may be improved by the above described operation.

The plurality of capacitors 14 are mounted in the third region 33 of the substrate 10. The capacitor 14 may be a capacitor for, for example, power loss protection (PLP), and may serve as a power backup function for the purpose of data protection at the time of unexpected power interruption. For example, the plurality of capacitors 14 may supply power to the controller 11, the DRAM 12, the NANDs 13, and the like for a predetermined time when a power supplied from the host apparatus is unexpectedly interrupted. That is, the plurality of capacitors 14 may supply power to the controller 11, the DRAM 12, the NANDs 13, and the like until write target data temporarily stored in the DRAM 12 is read from the DRAM 12, and transmission of the write target data to the NANDs 13 is completed. Thus, even when a power supply is unexpectedly interrupted, data loss can be prevented.

In the first embodiment, a relatively small capacitor may be employed as the capacitor 14. Then, by electrically connecting the plurality of capacitors 14 in parallel, a capacitance required for the above described power backup function is secured. As an example of the capacitor 14, a conductive-polymer aluminum electrolytic capacitor, a conductive-polymer tantalum solid electrolytic capacitor or the like may be employed. Using such a small capacitor can reduce the thickness of the semiconductor memory device 1 to provide the capacitor 14 for PLP. The thickness of the semiconductor memory device 1 according to the first embodiment may be equal to or less than, for example, a thickness defined in the M.2 standard of PCI Express (registered trademark). The details of the M.2 standard are defined by a standardization organization such as PCI-SIG or SATA-IO. Meanwhile, the semiconductor memory device 1 is not limited to the above described example, and may be one conforming to another standard, or one not conforming to a general standard.

In the first embodiment, for example, the plurality of capacitors 14 include thirteen capacitors 14A to 14M mounted on the first surface 10a of the substrate 10, and thirteen capacitors 14N to 14Z mounted on the second surface 10b of the substrate 10. The capacitors 14A to 14M mounted on the first surface 10a are grouped into the capacitors 14A to 14F provided in a first row, and the capacitors 14G to 14M provided in a second row.

The capacitors 14A to 14F in the first row are provided between the central portion of the substrate 10 and the first side portion 26a in the Y direction. The capacitors 14A to 14F in the first row are aligned in one row along the X direction at substantially equal intervals so as to be adjacent to each other. Here, each of the capacitors 14 includes a positive electrode terminal 14a and a negative electrode terminal 14b. Each of the capacitors 14A to 14F in the first row is provided such that the positive electrode terminal 14a faces the center side of the substrate 10, and the negative electrode terminal 14b faces the first side portion 26a of the substrate 10. In the first embodiment, the capacitor 14B is an example of a "first capacitor." The capacitor 14C is an example of a "second capacitor." The capacitor 14E is an example of a "fifth capacitor," and is located opposite to the capacitor 14B with respect to the capacitor 14C. A first gap g1 may be formed between a capacitor located closest to the +X direction side among the capacitors in the first row (e.g., the capacitor 14F among the capacitors 14A to 14F), and a NAND (e.g., the NAND 13A) located closest to the −X direction side among NANDs (e.g., the two NANDs 13A and 13B). The first gap g1 may be an area where the temperature sensor 16 to be described below is mounted, and is relatively widely formed.

As illustrated in FIG. 1, the capacitors 14G to 14M in the second row are arranged between the central portion of the substrate 10 and the second side portion 26b in the Y direction. For example, the capacitors 14G to 14M in the second row may be aligned in one row along the X direction at substantially equal intervals so as to be adjacent to each other. For example, each of the capacitors 14G to 14M in the second row may be arranged such that the positive electrode terminal 14a faces the center side of the substrate 10, and the negative electrode terminal 14b faces the second side portion 26b of the substrate 10. In the first embodiment, the capacitor 14I is an example of a "third capacitor," and is aligned with the capacitor 14B (the first capacitor) in the Y direction. The capacitor 14J is an example of a "fourth capacitor," and is aligned with the capacitor 14C (the second capacitor) in the Y direction.

A second gap g2 may be formed between a capacitor located closest to the +X direction side among the capacitors in the second row (e.g., the capacitor 14M among the capacitors 14G to 14M), and a NAND (e.g., the NAND 13A). In the first embodiment, a maximum width W2 of the second gap g2 in the X direction may be narrower than a maximum width W1 of the first gap g1 in the X direction. Thus, the capacitors 14A to 14F in the first row and the capacitors 14G to 14M in the second row are displaced in relation to one another in the X direction.

As illustrated in FIG. 1, a first space S1 extending in the X direction is formed between the group of capacitors 14A to 14F in the first row, and the group of capacitors 14G to 14M in the second row. For example, the first space S1 may linearly extend in the X direction from a capacitor closest to the controller 11 (e.g., the capacitor 14G) to a capacitor closest to the NAND 13A among the capacitors 14 (e.g., the capacitor 14M) mounted on the first surface 10a.

Meanwhile, the capacitors 14N to 14Z mounted on the second surface 10b may be grouped into the capacitors 14N to 14S provided in a third row, and the capacitors 14T to 14Z provided in a fourth row.

As illustrated in FIG. 1, the capacitors 14N to 14S in the third row are disposed between the central portion of the substrate 10 and the first side portion 26a in the Y direction. The capacitors 14N to 14S in the third row may be aligned in one row along the X direction at substantially equal intervals so as to be adjacent to each other. Each of the capacitors 14N to 14S in the third row may be provided such that the positive electrode terminal 14a faces the center side of the substrate 10, and the negative electrode terminal 14b faces the first side portion 26a of the substrate 10. In the first embodiment, the capacitor 14O is an example of a "sixth capacitor." The capacitor 14P is an example of a "seventh capacitor."

A third gap g3 may be formed between a capacitor located closest to the +X direction side among the capacitors in the third row (e.g., the capacitor 14S among the capacitors 14N to 14S), and a NAND located closest to the −X direction side among the NANDs (e.g., the NAND 13C among the two NANDs 13C and 13D). In the first embodiment, a maximum width W3 of the third gap g3 in the X direction may be narrower than the maximum width W1 of the first gap g1 in the X direction and may be wider than the maximum width W2 of the second gap g2 in the X direction. Thus, the capacitors 14A to 14F in the first row and the capacitors 14N to 14S in the third row are displaced in relation to one another in the X direction. That is, individual gaps between the capacitors 14A to 14F in the first row, and individual gaps between the capacitors 14N to 14S in the third row may be located at different positions in the X direction. According to such an arrangement, the substrate 10 is hardly warped, and thus the strength and reliability of the semiconductor memory device 1 can be improved.

As illustrated in FIG. 1, the capacitors 14T to 14Z in the fourth row are disposed between the central portion of the substrate 10 and the second side portion 26b in the Y direction. The capacitors 14T to 14Z in the fourth row may be aligned in one row along the X direction at substantially equal intervals so as to be adjacent to each other. Each of the capacitors 14T to 14Z in the fourth row may be provided such that the positive electrode terminal 14a faces the center side of the substrate 10, and the negative electrode terminal 14b faces the second side portion 26b of the substrate 10.

The third gap g3 may be formed between a capacitor located closest to the +X direction side among the capacitors in the fourth row (e.g., the capacitor 14Z among the capacitors 14T to 14Z), and a NAND (e.g., the NAND 13C). Thus, the capacitors 14G to 14M in the second row, and the capacitors 14T to 14Z in the fourth row may be displaced in relation to one another in the X direction. That is, individual gaps between the capacitors 14G to 14M in the second row, and individual gaps between the capacitors 14T to 14Z in the fourth row may be located at different positions in the X direction. According to such an arrangement, the substrate 10 is hardly warped, and thus the strength and reliability of the semiconductor memory device 1 can be improved.

A second space S2 extending in the X direction may be formed between the group of capacitors 14N to 14S in the third row, and the group of capacitors 14T to 14Z in the fourth row. The second space S2 may linearly extend in the X direction from a capacitor closest to the controller 11 (e.g., the capacitor 14T) to a capacitor closest to a NAND (e.g., the NAND 13C) among the capacitors 14 (e.g., the capacitor 14Z) mounted on the second surface 10b.

As illustrated in FIG. 1, the plurality of jumper elements 15 are mounted in the third region 33 of the substrate 10. The jumper element 15 may be a 0-ohm resistor, or an electronic component having an electrical resistance lower than other electronic components. The jumper element 15 is an example of a connecting component that connects a plurality of separate conductor portions to each other. The jumper element 15 is, for example, a rectangular parallelepiped chip component (e.g., a chip resistor), but is not limited thereto.

The plurality of jumper elements 15 include, for example, two jumper elements 15A and 15B mounted on the first surface 10a of the substrate 10, and two jumper elements 15C and 15D mounted on the second surface 10b of the substrate 10. In the first embodiment, the jumper elements 15A and 15B may be disposed in the first space S1 between the group of capacitors 14A to 14F in the first row and the group of capacitors 14G to 14M in the second row. Meanwhile, the jumper elements 15C and 15D may be disposed in the second space S2 between the group of capacitors 14N to 14S in the third row and the group of capacitors 14T to 14Z in the fourth row. The role of the jumper elements 15 will be described below.

As illustrated in FIG. 1, the temperature sensor 16 is disposed in the gap g1 between the capacitor 14F and the NAND 13A. The temperature sensor 16 may measure the temperature of the substrate 10, at a location in the vicinity of the NAND 13A closest to the controller 11, among the plurality of NANDs 13. The measurement result of the temperature sensor 16 may be output to the controller 11. The controller 11 may control the operation speed of the semiconductor memory device 1 such that the temperature measured by the temperature sensor 16 falls below an operation-guarantee temperature of the NANDs 13. For example, when the temperature measured by the temperature sensor 16 exceeds a certain threshold value, the controller 11 may reduce the operation speed of the semiconductor memory device 1, thereby reducing heat generation of the controller 11, and then preventing the temperature of the NANDs 13 from exceeding the operation-guarantee temperature.

The power supply unit 17, the capacitor charge/discharge control circuit 18, and the capacitor capacity measurement circuit 19 may be provided on, for example, the second surface 10b in the first region 31 of the substrate 10. The power supply unit 17 includes, for example, a power supply circuit chip 17a, and a plurality of capacitors 17b disposed in the vicinity of the power supply circuit chip 17a. The power supply circuit chip 17a, the capacitor charge/discharge control circuit 18, and the capacitor capacity measurement circuit 19 may be, for example, integrated circuit components which are mounted on the substrate 10, respectively.

FIG. 2 is a block diagram illustrating a part of a functional configuration of the semiconductor memory device 1. When power is supplied from the host apparatus to the semiconductor memory device 1, the power supply unit 17 may receive the power from the host apparatus (see the arrow A in the drawing). The power supply unit 17 may generate power of a desired voltage from the power supplied from the host apparatus, and supply the generated power to respective components of the semiconductor memory device 1. For example, the power supply unit 17 may supply the power to the controller 11, the DRAM 12, the NANDs 13, and the like.

For example, when the semiconductor memory device 1 boots up, the capacitor charge/discharge control circuit 18 may charge the plurality of capacitors 14 using the power supplied from the host apparatus (see the arrow B in the drawing). When the charging of the capacitors 14 is completed, the power supplied from the host apparatus may be sent to only the power supply unit 17. When the power supply from the host apparatus to the semiconductor memory device 1 is unexpectedly interrupted, the capacitor charge/discharge control circuit 18 may make the plurality of capacitors 14 discharge electricity such that charges stored in the plurality of capacitors 14 are supplied to the power supply unit 17 (see the arrow C in the drawing). The power supply unit 17 may generate power of a desired voltage from the power supplied from the capacitors 14, and supply the generated power to the respective components of the semiconductor memory device 1. Therefore, the above described power-backup function is achieved.

The capacitor capacity measurement circuit 19 may measure the capacitance of the plurality of capacitors 14 at a constant period at the time of boot-up of the semiconductor memory device 1, and thereafter. The measurement result of the capacitor capacity measurement circuit 19 may be output to the controller 11. The controller 11 can monitor a reduction in capacitance due to aged deterioration or abnormality of the capacitors 14 based on the measurement result of the capacitor capacity measurement circuit 19.

Next, the conductor pattern 22 of the semiconductor memory device 1 will be described. FIG. 3 is a view illustrating a part of the conductor pattern 22 of the semiconductor memory device 1. The upper portion in FIG. 3 illustrates the first surface 10a side of the substrate 10. The lower portion in FIG. 3 illustrates the second surface 10b side of the substrate 10. The conductor pattern 22 includes a NAND power supply pattern (not illustrated), a capacitor power supply pattern 42, a ground pattern 43, and a wiring pattern 44. Here, for convenience of explanation, the capacitor power supply pattern 42 and the ground pattern 43 are hatched.

As illustrated in FIG. 3, the NAND power supply pattern may be electrically connected to the power supply unit 17 and the plurality of NANDs 13 to supply the power generated by the power supply unit 17 to the plurality of NANDs 13. The NAND power supply pattern may extend from the first region 31 to the second region 32 through the third region 33 in the substrate 10.

The capacitor power supply pattern 42 may be electrically connected to the power supply unit 17 and the plurality of capacitors 14. When the plurality of capacitors 14 are charged, the capacitor power supply pattern 42 may supply the power supplied from the host apparatus to the plurality of capacitors 14. When the plurality of capacitors 14 are discharged, the capacitor power supply pattern 42 may supply the power discharged from the plurality of capacitors 14 to the power supply unit 17. Hereinafter, the capacitor power supply pattern 42 will be simply referred to as "the power supply pattern 42."

As illustrated in FIG. 3, the power supply pattern 42 includes first to sixth conductor portions 51 to 56. The first to sixth conductor portions 51 to 56 are provided in the third region 33 of the substrate 10. Each of the first to sixth conductor portions 51 to 56 may be formed in a plate shape. The term "plate shape" mentioned herein means a shape having an area in two directions, that is, the X direction and the Y direction.

In the first embodiment, for example, the first to third conductor portions 51 to 53 are provided on a surface layer in the substrate 10 at the first surface 10a side. Here, the term "surface layer" means a layer closest to the outside of the substrate 10 among several layers of the substrate 10 having the conductor pattern 22, and also includes such a layer covered with a solder resist SR (see FIG. 5). The first to third conductor portions 51 to 53 may be aligned in one row along the X direction. The third conductor portion 53 is located opposite to the first conductor portion 51 with respect to the second conductor portion 52.

As illustrated in FIG. 3, the first conductor portion 51 may extend over a region overlapping the capacitors 14A and 14B in the first row in the Z direction, and a region overlapping the capacitors 14G, 14H, and 14I in the second row in the Z direction, on the substrate 10. For example, the first conductor portion 51 overlaps the positive electrode terminals 14a of the capacitors 14A and 14B in the first row in the Z direction, and overlaps the positive electrode terminals 14a of the capacitors 14G, 14H, and 14I in the second row in the Z direction. The positive electrode terminals 14a of the capacitors 14A and 14B in the first row and the positive electrode terminals 14a of the capacitors 14G, 14H, and 14I in the second row may be fixed to the surface of the first conductor portion 51 by soldering, for example. Accordingly, the first conductor portion 51 can be electrically connected to the capacitors 14A and 14B in the first row and the capacitors 14G, 14H, and 14I in the second row.

The second conductor portion 52 may extend over a region overlapping the capacitors 14C and 14D in the first row in the Z direction, and a region overlapping the capacitors 14J and 14K in the second row in the Z direction, on the substrate 10. For example, the second conductor portion 52 overlaps the positive electrode terminals 14a of the capacitors 14C and 14D in the first row in the Z direction, and overlaps the positive electrode terminals 14a of the capacitors 14J and 14K in the second row in the Z direction. The positive electrode terminals 14a of the capacitors 14C and 14D in the first row and the positive electrode terminals 14a of the capacitors 14J and 14K in the second row may be fixed to the surface of the second conductor portion 52 by soldering, for example. Accordingly, the second conductor portion 52 can be electrically connected to the capacitors 14C and 14D in the first row and the capacitors 14J and 14K in the second row.

The third conductor portion 53 may extend over a region overlapping the capacitors 14E and 14F in the first row in the Z direction, and a region overlapping the capacitors 14L and 14M in the second row in the Z direction, on the substrate 10. For example, the third conductor portion 53 overlaps the positive electrode terminals 14a of the capacitors 14E and 14F in the first row in the Z direction, and overlaps the positive electrode terminals 14a of the capacitors 14L and 14M in the second row in the Z direction. The positive electrode terminals 14a of the capacitors 14E and 14F in the first row and the positive electrode terminals 14a of the capacitors 14L and 14M in the second row may be fixed to the surface of the third conductor portion 53 by soldering, for example. Accordingly, the third conductor portion 53 can be electrically connected to the capacitors 14E and 14F in the first row and the capacitors 14L and 14M in the second row.

Meanwhile, the fourth to sixth conductor portions 54 to 56 may be provided on a surface layer in the substrate 10 at the second surface 10b side. That is, the fourth to sixth conductor portions 54 to 56 may be provided at positions different from those of the first to third conductor portions 51 to 53, in the Z direction. The fourth to sixth conductor portions 54 to 56 may be aligned in one row along the X direction. The sixth conductor portion 56 may be located opposite to the fourth conductor portion 54 with respect to the fifth conductor portion 55.

The fourth conductor portion 54 may extend over a region overlapping the capacitors 14N and 14O in the third row in the Z direction, and a region overlapping the capacitors 14T, 14U, and 14V in the fourth row in the Z direction, on the substrate 10. For example, the fourth conductor portion 54 overlaps the positive electrode terminals 14a of the capacitors 14N and 14O in the third row in the Z direction, and overlaps the positive electrode terminals 14a of the capacitors 14T, 14U, and 14V in the fourth row in the Z direction. The positive electrode terminals 14a of the capacitors 14N and 14O in the third row and the positive electrode terminals 14a of the capacitors 14T, 14U, and 14V in the fourth row may be fixed to the surface of the fourth conductor portion 54 by soldering, for example. Accordingly, the fourth conductor portion 54 can be electrically connected to the capacitors 14N and 14O in the third row and the capacitors 14T, 14U, and 14V in the fourth row.

As illustrated in FIG. 3, the fifth conductor portion 55 may extend over a region overlapping the capacitors 14P and 14Q in the third row in the Z direction, and a region overlapping the capacitors 14W and 14X in the fourth row in the Z direction, on the substrate 10. For example, the fifth conductor portion 55 overlaps the positive electrode terminals 14a of the capacitors 14P and 14Q in the third row in the Z direction, and overlaps the positive electrode terminals 14a of the capacitors 14W and 14X in the fourth row in the Z direction. The positive electrode terminals 14a of the capacitors 14P and 14Q in the third row and the positive electrode terminals 14a of the capacitors 14W and 14X in the fourth row may be fixed to the surface of the fifth conductor portion 55 by soldering, for example. Accordingly, the fifth conductor portion 55 can be electrically connected to the capacitors 14P and 14Q in the third row and the capacitors 14W and 14X in the fourth row.

The sixth conductor portion 56 may extend over a region overlapping the capacitors 14R and 14S in the third row in the Z direction, and a region overlapping the capacitors 14Y and 14Z in the fourth row in the Z direction, on the substrate 10. For example, the sixth conductor portion 56 overlaps the positive electrode terminals 14a of the capacitors 14R and 14S in the third row in the Z direction, and overlaps the positive electrode terminals 14a of the capacitors 14Y and 14Z in the fourth row in the Z direction. The positive electrode terminals 14a of the capacitors 14R and 14S in the third row and the positive electrode terminals 14a of the capacitors 14Y and 14Z in the fourth row may be fixed to the surface of the sixth conductor portion 56 by soldering, for example. Accordingly, the sixth conductor portion 56 can be electrically connected to the capacitors 14R and 14S in the third row and the capacitors 14Y and 14Z in the fourth row.

The details and connection relationship of the first to sixth conductor portions 51 to 56 will be described below.

As illustrated in FIG. 3, the ground pattern 43 includes first to fourth ground portions 61 to 64. The first to fourth ground portions 61 to 64 may extend from the first region 31 to the second region 32 through the third region 33 on the substrate 10.

For example, the first and second ground portions 61 and 62 are provided on the surface layer in the substrate 10 at the first surface 10a side. The first ground portion 61 may be provided along the first side portion 26a of the substrate 10. The first ground portion 61 may overlap the negative electrode terminals 14b of the capacitors 14A to 14F in the first row in the Z direction. The negative electrode terminals 14b of the capacitors 14A to 14F in the first row may be fixed to the surface of the first ground portion 61 by soldering, for example. Accordingly, the first ground portion 61 can be electrically connected to the capacitors 14A to 14F in the first row.

The second ground portion 62 may be provided along the second side portion 26b of the substrate 10. The second ground portion 62 may overlap the negative electrode terminals 14b of the capacitors 14G to 14M in the second row in the Z direction. The negative electrode terminals 14b of the capacitors 14G to 14M in the second row may be fixed to the surface of the second ground portion 62 by soldering, for example. Accordingly, the second ground portion 62 can be electrically connected to the capacitors 14G to 14M in the second row.

Meanwhile, the third and fourth ground portions 63 and 64 are provided on the surface layer in the substrate 10 at the second surface 10b side. The third ground portion 63 may be provided along the first side portion 26a of the substrate 10. The third ground portion 63 may overlap the negative electrode terminals 14b of the capacitors 14N to 14S in the third row in the Z direction. The negative electrode terminals 14b of the capacitors 14N to 14S in the third row may be fixed to the surface of the third ground portion 63 by soldering, for example. Accordingly, the third ground portion 63 can be electrically connected to the capacitors 14N to 14S in the third row.

The fourth ground portion 64 may be provided along the second side portion 26b of the substrate 10. The fourth ground portion 64 may overlap the negative electrode terminals 14b of the capacitors 14T to 14Z in the fourth row in the Z direction. The negative electrode terminals 14b of the capacitors 14T to 14Z in the fourth row may be fixed to the surface of the fourth ground portion 64 by soldering, for example. Accordingly, the fourth ground portion 64 can be electrically connected to the capacitors 14T to 14Z in the fourth row.

As illustrated in FIG. 3, the wiring pattern 44 includes a plurality of signal lines 44a electrically connecting the controller 11 and the plurality of NANDs 13. The signal lines 44a may extend from the first region 31 to the second region 32 through the third region 33 in the substrate 10. In the first embodiment, for example, the signal line 44a may extend in the X direction through a region overlapping, in the Z direction, any one of the capacitors 14A to 14F in the first row, the capacitors 14G to 14M in the second row, the capacitors 14N to 14S in the third row, and the capacitors 14T to 14Z in the fourth row. For example, the signal line 44a extends in the X direction through a region overlapping, in the Z direction, a portion between the positive electrode terminal 14a and the negative electrode terminal 14b of the capacitor 14, with respect to any one of the capacitors 14A to 14F in the first row, the capacitors 14G to 14M in the second row, the capacitors 14N to 14S in the third row, and the capacitors 14T to 14Z in the fourth row. According to such a configuration, even when the plurality of capacitors 14 are provided, at least a part of the wiring pattern 44 may be provided on the surface layer of the substrate 10. When at least a part of the wiring pattern 44 may be provided on the surface layer, the degree of freedom to design the wiring layout in the inner layers of the substrate 10 can be improved.

Figure 4A:
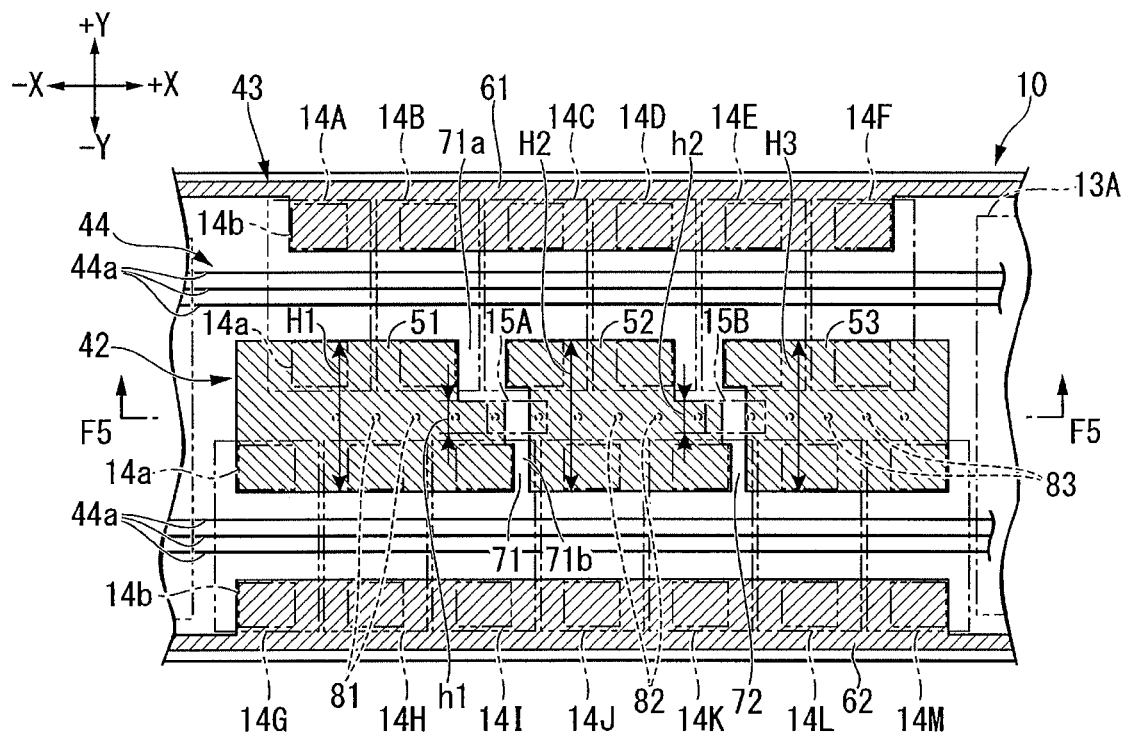
FIG. 4A is a plan view illustrating a region surrounded by the line F4A illustrated in FIG. 3 in an enlarged scale.

Next, the details and connection relationship of the first to sixth conductor portions 51 to 56 will be described. FIG. 4A is a plan view illustrating a region surrounded by the line F4A illustrated in FIG. 3 in an enlarged scale. As illustrated in FIG. 4A, the first conductor portion 51 and the second conductor portion 52 may be separated from each other in the X direction. That is, the power supply pattern 42 does not include a conductor between the first conductor portion 51 and the second conductor portion 52. The substrate 10 may have a non-conductor portion 71 between the first conductor portion 51 and the second conductor portion 52. The non-conductor portion is an example of a "first non-conductor portion." The non-conductor portion 71 is formed of a part of an insulator forming the substrate 10.

As illustrated in FIG. 4A, the non-conductor portion 71 has a first portion 71a overlapping the capacitor 14 (e.g., the capacitor 14B) in the first row in the Z direction, and a second portion 71b overlapping the capacitor 14 (e.g., the capacitor 14I) in the second row in the Z direction. In the first embodiment, as described above, the capacitors 14A to 14F in the first row and the capacitors 14G to 14M in the second row may be shifted from each other in the X direction. Thus, the first portion 71a and the second portion 71b of the non-conductor portion 71 can be provided at different positions in the X direction.

In the first embodiment, for example, the first conductor portion 51 and the second conductor portion 52 are electrically connected to each other by the first jumper element 15A mounted on the first surface 10a of the substrate 10. Here, each jumper element 15 includes a first terminal 15a and a second terminal 15b (see FIG. 5). For example, the first terminal 15a of the first jumper element 15A is fixed to the surface of the first conductor portion 51 by solder Q. The second terminal 15b of the first jumper element 15A is fixed to the surface of the second conductor portion 52 by solder Q. Accordingly, the first conductor portion 51 and the second conductor portion 52 can be electrically connected to each other via the first jumper element 15A. The first jumper element 15A can be detachable from the substrate 10 by melting the solder Q. When the first jumper element 15A is detached from the substrate 10, the first conductor portion 51 and the second conductor portion 52 can be electrically insulated from each other. A maximum width h1 of the first jumper element 15A in the Y direction may be narrower than a maximum width H1 of the first conductor portion 51 in the Y direction, and also may be narrower than a maximum width H2 of the second conductor portion 52 in the Y direction.

In the first embodiment, for example, a part of the first jumper element 15A is disposed between the capacitor 14B (i.e., the first capacitor) in the first row and the capacitor 14I (i.e., the third capacitor) in the second row. Here, the phrase "a jumper element is disposed between a capacitor A and a capacitor B" means that when the substrate 10 is viewed along the Z direction, an imaginary line connecting any one point on the capacitor A (e.g., P1 in FIG. 1) to any one point on the capacitor B (e.g., P2 in FIG. 1) overlaps the jumper element in the Z direction. This definition is the same for the relationship between the second to fourth jumper elements 15B to 15D and other capacitors 14. In the first embodiment, for example, another part of the first jumper element 15A is disposed between the capacitor 14C (i.e., the second capacitor) in the first row, and the capacitor 14J (i.e., the fourth capacitor) in the second row.

Likewise, as illustrated in FIG. 4A, the second conductor portion 52 and the third conductor portion 53 are separated from each other in the X direction. That is, the power supply pattern 42 does not include a conductor between the second conductor portion 52 and the third conductor portion 53. The substrate 10 may have a non-conductor portion 72 between the second conductor portion 52 and the third conductor portion 53. The non-conductor portion 72 may be formed of a part of an insulator forming the substrate 10.

In the first embodiment, for example, the second conductor portion 52 and the third conductor portion 53 are electrically connected to each other by the second jumper element 15B mounted on the first surface 10a of the substrate 10. For example, the first terminal 15a of the second jumper element 15B is fixed to the surface of the second conductor portion 52 by solder Q. The second terminal 15b of the second jumper element 15B is fixed to the surface of the third conductor portion 53 by solder Q. Accordingly, the second conductor portion 52 and the third conductor portion 53 can be electrically connected to each other via the second jumper element 15B. The second jumper element 15B can be detachable from the substrate 10 by melting the solder Q. When the second jumper element 15B is detached from the substrate 10, the second conductor portion 52 and the third conductor portion 53 can be electrically insulated from each other. A maximum width h2 of the second jumper element 15B in the Y direction may be narrower than the maximum width H2 of the second conductor portion 52 in the Y direction, and also may be narrower than a maximum width H3 of the third conductor portion 53 in the Y direction.

Figure 4B:
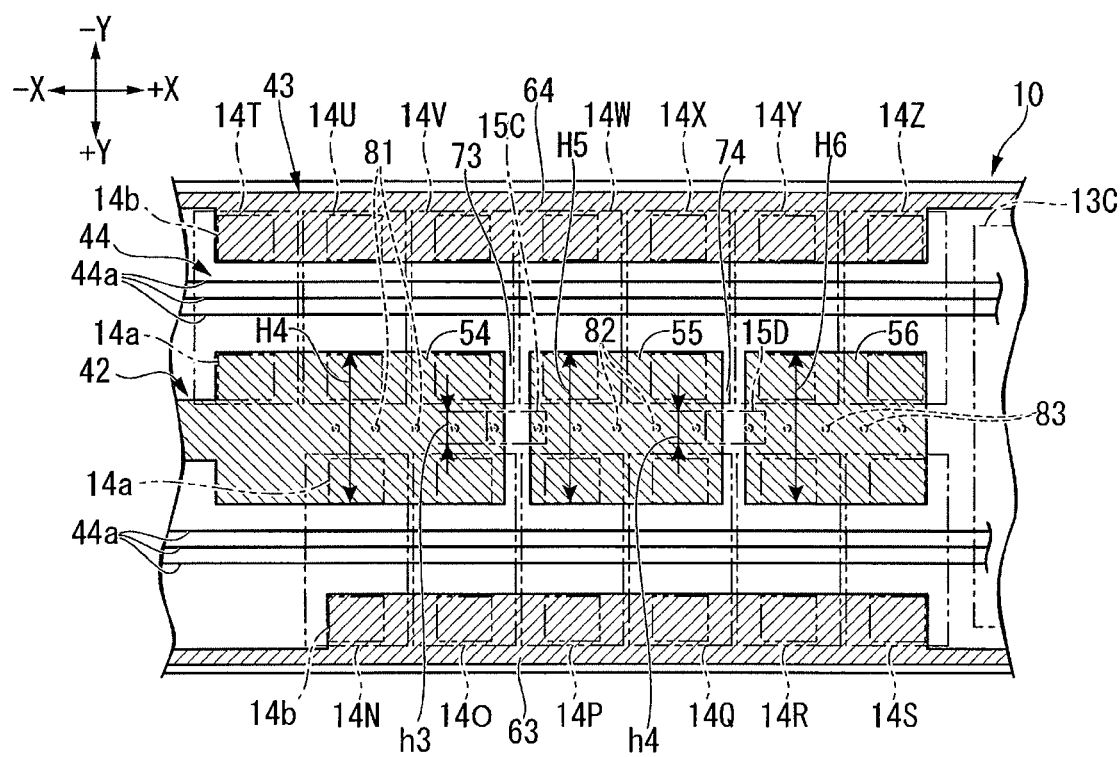
FIG. 4B is a plan view illustrating a region surrounded by the line F4B illustrated in FIG. 3 in an enlarged scale.

FIG. 4B is a plan view illustrating a region surrounded by the line F4B illustrated in FIG. 3 in an enlarged scale. As illustrated in FIG. 4B, the fourth conductor portion 54 and the fifth conductor portion 55 are separated from each other in the X direction. That is, the power supply pattern 42 does not include a conductor between the fourth conductor portion 54 and the fifth conductor portion 55. The substrate 10 may have a non-conductor portion 73 between the fourth conductor portion 54 and the fifth conductor portion 55. The non-conductor portion 73 is an example of a "second non-conductor portion." The non-conductor portion 73 may be formed of a part of an insulator forming the substrate 10. In the first embodiment, for example, at least a part of the non-conductor portion 71 (i.e., the first non-conductor portion) at the first surface 10a side, and at least a part of the non-conductor portion 73 (i.e., the second non-conductor portion) at the second surface 10b side may overlap each other in the Z direction. However, the positional relationship between the non-conductor portion 71 and the non-conductor portion 73 is not limited to the above described example.

In some embodiments, the non-conductor portion 71 and the non-conductor portion 73 do not overlap each other in the Z direction.

Here, in the first embodiment, for example, the capacitors 14G to 14M in the second row and the capacitors 14T to 14Z in the fourth row are shifted from each other in the X direction. In the first embodiment, for example, when the capacitor 14I closest to the non-conductor portion 71 at the first surface 10a side among the capacitors 14G to 14M in the second row, and the capacitor 14V closest to the non-conductor portion 73 at the second surface 10b side among the capacitors 14T to 14Z in the fourth row are selected as a reference respectively, the location of the non-conductor portion 71 with respect to the edge portion of the capacitor 14I at the +X direction side may be different from the location of the non-conductor portion 73 with respect to the edge portion of the capacitor 14V at the +X direction side. Accordingly, in a configuration where the capacitors 14G to 14M in the second row and the capacitors 14T to 14Z in the fourth row are shifted from each other in the X direction, at least apart of the non-conductor portion 71 may overlap at least a part of the non-conductor portion 73 in the Z direction.

In the first embodiment, for example, the fourth conductor portion 54 and the fifth conductor portion 55 are electrically connected to each other by the third jumper element 15C mounted on the second surface 10b of the substrate 10. For example, the first terminal 15a of the third jumper element 15C is fixed to the surface of the fourth conductor portion 54 by solder Q. The second terminal 15b of the third jumper element 15C is fixed to the surface of the fifth conductor portion 55 by solder Q. Accordingly, the fourth conductor portion 54 and the fifth conductor portion 55 can be electrically connected to each other via the third jumper element 15C. The third jumper element 15C can be detachable from the substrate 10 by melting the solder Q. When the third jumper element 15C is detached from the substrate 10, the fourth conductor portion 54 and the fifth conductor portion 55 can be electrically insulated from each other. A maximum width h3 of the third jumper element 15C in the Y direction may be narrower than a maximum width H4 of the fourth conductor portion 54 in the Y direction, and also may be narrower than a maximum width H5 of the fifth conductor portion 55 in the Y direction.

In the first embodiment, for example, at least apart of the first jumper element 15A overlaps at least a part of the third jumper element 15C in the Z direction. That is, the positions of the first jumper element 15A and the third jumper element 15C in the X direction and the Y direction may be substantially the same. However, the positional relationship between the first jumper element 15A and the third jumper element 15C is not limited to the above described example. In some embodiments, the first jumper element 15A and the third jumper element 15C do not overlap each other in the Z direction.

Likewise, as illustrated in FIG. 4B, the fifth conductor portion 55 and the sixth conductor portion 56 are separated from each other in the X direction. That is, the power supply pattern 42 does not include a conductor between the fifth conductor portion 55 and the sixth conductor portion 56. The substrate 10 may have a non-conductor portion 74 between the fifth conductor portion 55 and the sixth conductor portion 56. The non-conductor portion 74 may be formed of a part of an insulator forming the substrate 10. In the first embodiment, for example, at least a part of the non-conductor portion 72 at the first surface 10a side and at least apart of the non-conductor portion 74 at the second surface 10b side overlap each other in the Z direction. However, the positional relationship between the non-conductor portion 72 and the non-conductor portion 74 is not limited to the above described example. In some embodiments, the non-conductor portion 72 and the non-conductor portion 74 do not overlap each other in the Z direction.

In the first embodiment, for example, the fifth conductor portion 55 and the sixth conductor portion 56 are electrically connected to each other by the fourth jumper element 15D mounted on the second surface 10b of the substrate 10. For example, the first terminal 15a of the fourth jumper element 15D is fixed to the surface of the fifth conductor portion 55 by solder Q. The second terminal 15b of the fourth jumper element 15D is fixed to the surface of the sixth conductor portion 56 by solder Q. Accordingly, the fifth conductor portion 55 and the sixth conductor portion 56 can be electrically connected to each other via the fourth jumper element 15D. The fourth jumper element 15D can be detachable from the substrate 10 by melting the solder Q. When the fourth jumper element 15D is detached from the substrate 10, the fifth conductor portion 55 and the sixth conductor portion 56 can be electrically insulated from each other. Here, a maximum width h4 of the fourth jumper element 15D in the Y direction may be narrower than the maximum width H5 of the fifth conductor portion 55 in the Y direction, and also may be narrower than a maximum width H6 of the sixth conductor portion 56 in the Y direction.

In the first embodiment, for example, at least apart of the second jumper element 15B overlaps at least a part of the fourth jumper element 15D in the Z direction. In the first embodiment, for example, the second jumper element 15B and the fourth jumper element 15D are disposed at substantially the same positions in the X direction and the Y direction. However, the positional relationship between the second jumper element 15B and the fourth jumper element 15D is not limited to the above described example. In some embodiments, the second jumper element 15B and the fourth jumper element 15D do not overlap each other in the Z direction.

Next, vias 81 to 83 formed in the substrate 10 will be described. As illustrated in FIG. 4A and FIG. 4B, the substrate 10 has the plurality of vias 81 to 83. The term "via" mentioned in the present disclosure widely means a connection portion that electrically connects conductors disposed separately in a plurality of layers of the substrate 10, to each other. The "via" may be a via formed by plating the inner surface of a through hole (e.g., a through hole via), a via formed by filling a conductor in a hole formed in each insulating layer (e.g., a build-up via), or any other type of via.

As illustrated in FIG. 4A and FIG. 4B, the plurality of vias 81 are disposed in a region overlapping the first conductor portion 51 and the fourth conductor portion 54 in the Z direction. The plurality of vias 81 may extend through the inside of the substrate 10 in the Z direction to electrically connect the first conductor portion 51 to the fourth conductor portion 54. The via 81 is an example of a "first via."

The plurality of vias 82 may be disposed in a region overlapping the second conductor portion 52 and the fifth conductor portion 55 in the Z direction. The plurality of vias 82 may extend through the inside of the substrate 10 in the Z direction to electrically connect the second conductor portion 52 to the fifth conductor portion 55. The via 82 is an example of a "second via."

As illustrated in FIG. 4A and FIG. 4B, the plurality of vias 83 are disposed in a region overlapping the third conductor portion 53 and the sixth conductor portion 56 in the Z direction. The plurality of vias 83 may extend through the inside of the substrate 10 in the Z direction to electrically connect the third conductor portion 53 to the sixth conductor portion 56. The via 83 is an example of a "third via."

In the first embodiment, for example, the fourth conductor portion 54 (see FIG. 4B) is electrically connected to the power supply unit 17. The power supplied from the power supply unit 17 (see FIG. 3) may be supplied, at first, to the fourth conductor portion 54 among the first to sixth conductor portions 51 to 56. A part of the power supplied from the power supply unit 17 to the fourth conductor portion 54 may be supplied to the fifth conductor portion 55 through the third jumper element 15C. Apart of the power supplied to the fifth conductor portion 55 may be supplied to the sixth conductor portion 56 through the fourth jumper element 15D. Meanwhile, a part of the power supplied from the power supply unit 17 to the fourth conductor portion 54 may be supplied to the first conductor portion 51 through the plurality of vias 81. Apart of the power supplied to the first conductor portion 51 may be supplied to the second conductor portion 52 through the first jumper element 15A. To the second conductor portion 52, the power may be also supplied from the fifth conductor portion 55 through the plurality of vias 82. Apart of the power supplied to the second conductor portion 52 may be supplied to the third conductor portion 53 through the second jumper element 15B. To the third conductor portion 53, the power may be also supplied from the sixth conductor portion 56 through the plurality of vias 83. Accordingly, the power supplied from the power supply unit 17 to the fourth conductor portion 54 can conduct to the first to sixth conductor portions 51 to 56 to be supplied from the first to sixth conductor portions 51 to 56 to the capacitors 14.

Figure 5:
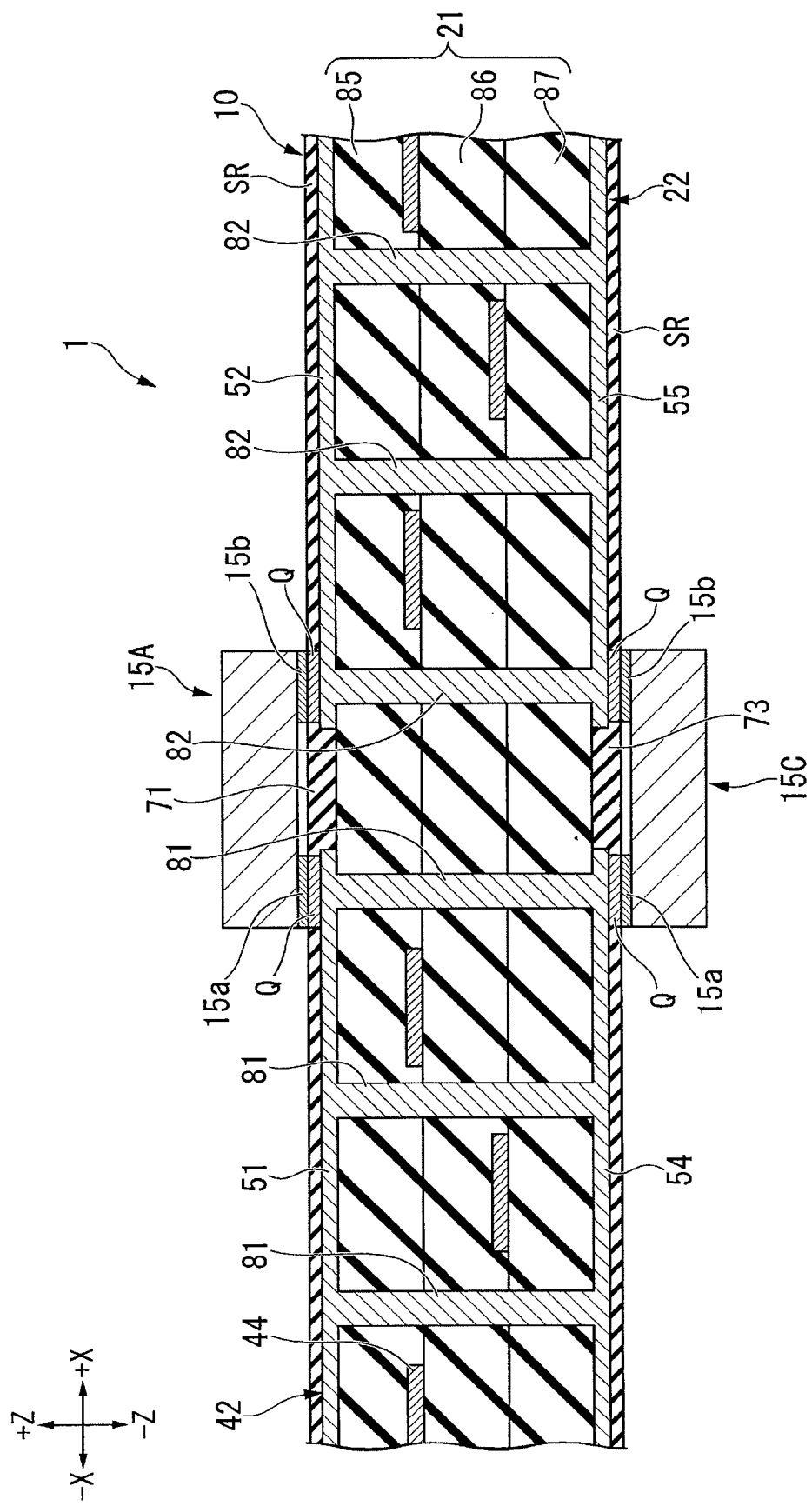
FIG. 5 is a sectional view taken along the line F5-F5 of the semiconductor memory device illustrated in FIG. 4A.

FIG. 5 is a sectional view taken along the line F5-F5 illustrated in FIG. 4A. Meanwhile, in FIG. 5, the shapes of the vias 81 and 82 and the like are schematically illustrated. As illustrated in FIG. 5, the substrate 10 includes, for example, first to third insulating layers 85 to 87. For example, the first to third insulating layers 85 to 87 are stacked in the Z direction. The wiring pattern 44 may be provided between the first insulating layer 85 and the second insulating layer 86, and between the second insulating layer 86 and the third insulating layer 87.

In the first embodiment, for example, the plurality of vias 81 extend through the first to third insulating layers 85 to 87 in the Z direction to connect the first conductor portion 51 and the fourth conductor portion 54. The plurality of vias 82 may extend through the first to third insulating layers 85 to 87 in the Z direction to connect the second conductor portion 52 and the fifth conductor portion 55. Although not illustrated, the plurality of vias 83 may extend through the first to third insulating layers 85 to 87 in the Z direction to connect the third conductor portion 53 and the sixth conductor portion 56.

Figure 6:
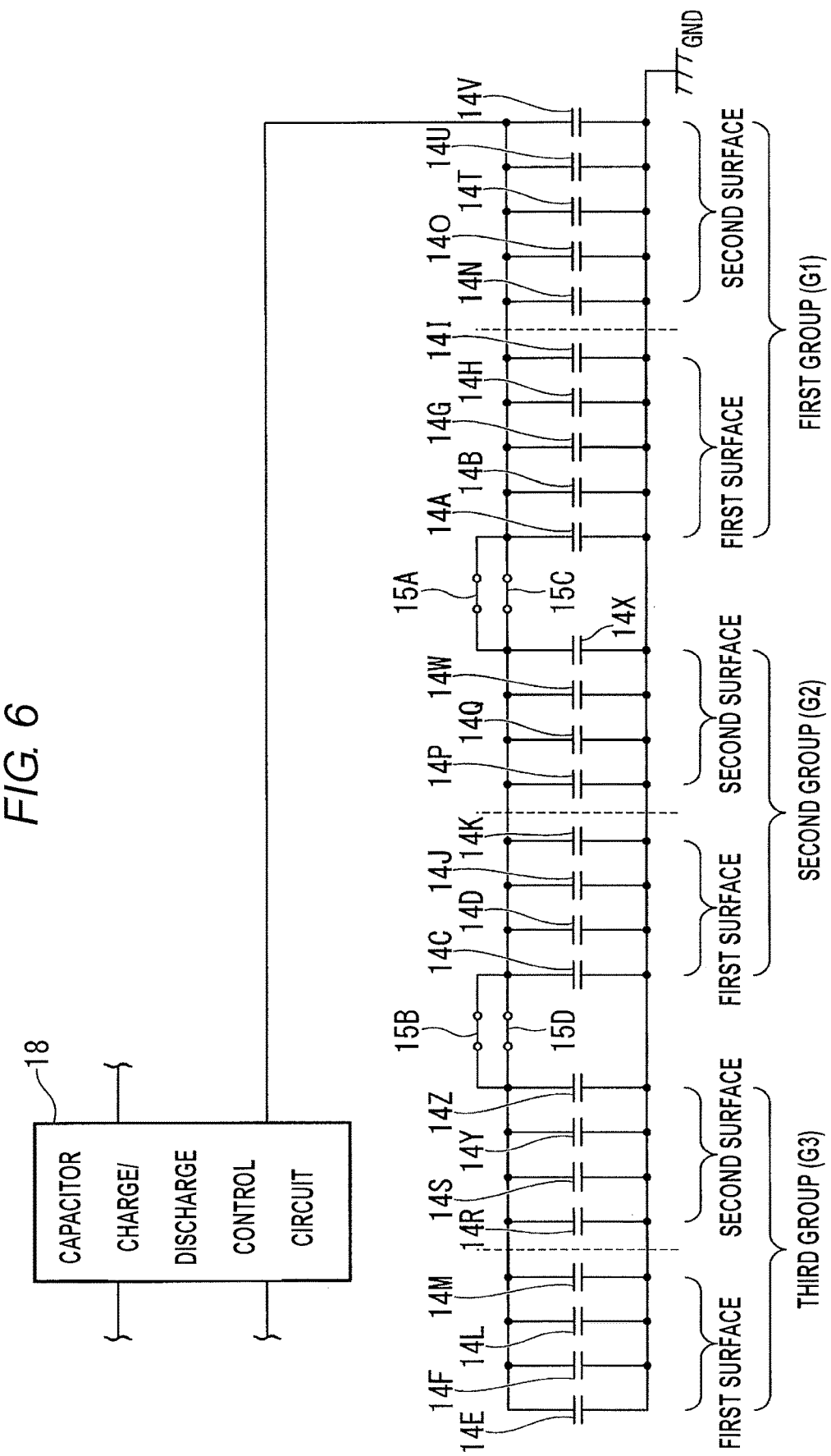
FIG. 6 is a view illustrating an electrical connection relationship among a plurality of capacitors in the first embodiment.

FIG. 6 is a view illustrating an electrical connection relationship among the plurality of capacitors 14. In the first embodiment, for example, the plurality of capacitors 14 are grouped into first to third groups G1 to G3. The first group G1 may include the capacitors 14A, 14B, 14G, 14H, and 14I electrically connected to the first conductor portion 51, and the capacitors 14N, 14O, 14T, 14U, and 14V electrically connected to the fourth conductor portion 54. The second group G2 may include the capacitors 14C, 14D, 14J, and 14K electrically connected to the second conductor portion 52, and the capacitors 14P, 14Q, 14W, and 14X electrically connected to the fifth conductor portion 55. The third group G3 may include the capacitors 14E, 14F, 14L, and 14M electrically connected to the third conductor portion 53, and the capacitors 14R, 14S, 14Y, and 14Z electrically connected to the sixth conductor portion 56.

The plurality of capacitors 14 in the first group G1 may be electrically connected to the plurality of capacitors 14 in the second group G2 through the first and third jumper elements 15A and 15C. The plurality of capacitors 14 in the second group G2 may be electrically connected to the plurality of capacitors 14 in the third group G3 through the second and fourth jumper elements 15B and 15D. The first to third groups G1 to G3 may be electrically insulated from each other when the first to fourth jumper elements 15A to 15D are detached from the substrate 10.

Figure 7:
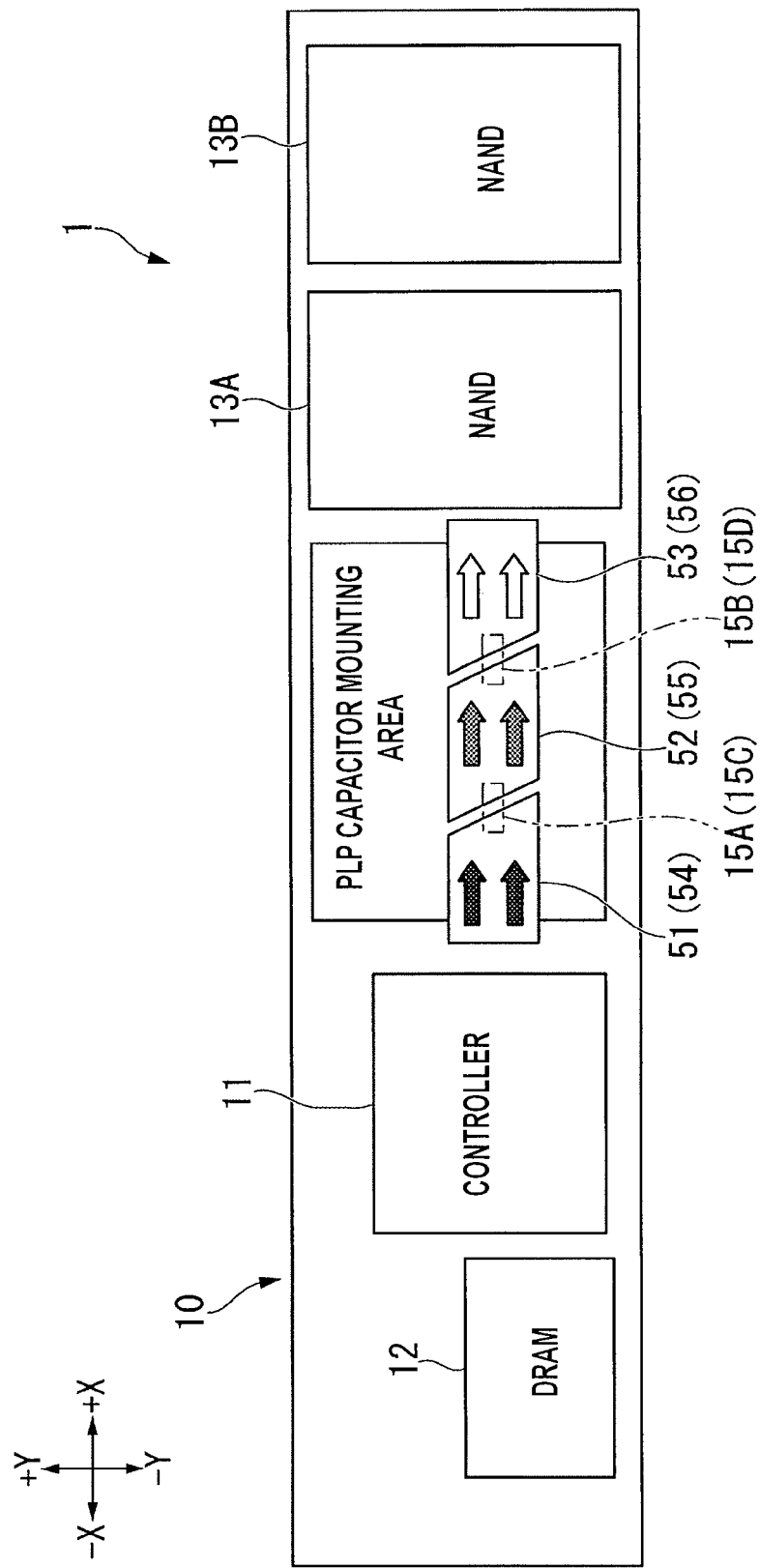
FIG. 7 is a view schematically illustrating a flow of heat from a controller toward NANDs in the first embodiment.

Next, an effect related to heat of the semiconductor memory device 1 according to the embodiment will be described. FIG. 7 is a view schematically illustrating the flow of heat from the controller 11 toward the NANDs 13. The arrow in FIG. 7 indicates the movement of heat. When the semiconductor memory device 1 operates, among components in the semiconductor memory device 1, the controller 11 generates the most heat. Here, the power supply pattern 42 may be made of a metal (e.g., copper foil), and thus has a high thermal conductivity. Thus, a part of heat generated by the controller 11 is likely to move from the controller 11 toward the NANDs 13 through the power supply pattern 42 present between the controller 11 and the NANDs 13. However, in the first embodiment, the power supply pattern 42 may be separated into some conductor portions 51 to 56 in the X direction. Thus, movement of heat may be reduced at locations where the conductor portions 51 to 56 are separated, thereby reducing the heat moving from the controller 11 toward the NANDs 13.

According to the semiconductor memory device 1 configured as described above, a temperature rise of the NANDs may be reduced. Here, as a comparative example, a configuration where the power supply pattern 42 is not separated into a plurality of conductor portions will be considered. In this case, a part of heat generated by the controller 11 may be transferred to the NANDs 13 through the power supply pattern 42, resulting in a temperature rise of the NANDs 13. In this case, the controller 11 may perform a processing of reducing an operation speed of the semiconductor memory device 1 such that the temperature of the NANDs 13 falls below an operation-guarantee temperature.

In the configuration of the above described comparative example, when one capacitor 14 among the plurality of capacitors 14 fails in an open mode or a short mode, it is required to sequentially detach the capacitors 14 from the substrate 10 one by one and to inspect them so as to specify the failed capacitor 14. This will reduce the efficiency of a failure analysis. In the most unfortunate case, unless all the capacitors 14 are detached, the failed capacitor 14 may not be determined.

Meanwhile, in the first embodiment, for example, the first conductor portion 51 and the second conductor portion 52 constituting a part of the power supply pattern 42 are separated from each other in the X direction, which is a direction of a heat flow, and are electrically connected to each other by the first jumper element 15A. According to such a configuration, the heat flowing from the controller 11 toward the NANDs 13 can be hardly conducted from the first conductor portion 51 to the second conductor portion 52, thereby reducing the heat finally conducted to the NANDs 13. Accordingly, the reliability of the semiconductor memory device 1 may be improved. Furthermore, reducing a temperature rise of the NANDs 13 can avoid the need to lower an operation speed of the semiconductor memory device 1. Thus, the reliability of the semiconductor memory device 1 can be maintained, while maintaining the operational performance of the semiconductor memory device 1. Therefore, the merchantability of the semiconductor memory device 1 can be improved.

According to a configuration where the first conductor portion 51 and the second conductor portion 52 are electrically connected to each other by the first jumper element 15A, it is possible to electrically insulate the first conductor portion 51 from the second conductor portion 52 by detaching the first jumper element 15A (in the first embodiment, both the first jumper element 15A and the third jumper element 15C) from the substrate 10. Thus, for example, when one capacitor 14 among the plurality of capacitors 14 fails in an open mode or a short mode, insulating the first conductor portion 51 and the second conductor portion 52 electrically from each other allows to determine which one of the first group G1 and the second group G2 includes the failed capacitor 14 by inspecting the conductivity between the first conductor portion 51 and the ground pattern 43, or between the second conductor portion 52 and the ground pattern 43. Accordingly, as compared to a case where all the capacitors 14 need to be sequentially detached from the substrate 10 and inspected one by one, the efficiency to determine the failed capacitor 14 may be improved. As a result, the efficiency of a failure analysis may be achieved.

In the first embodiment, for example, the first jumper element 15A is fixed to the substrate 10 using the solder Q, and is detachable from the substrate 10 by melting the solder Q. According to such a configuration, the first jumper element 15A may be easily detached from the substrate 10. Thus, it is possible to easily insulate the first conductor portion 51 and the second conductor portion 52 electrically from each other. Accordingly, further efficiency of a failure analysis may be achieved. In the first embodiment, for example, the first jumper element 15A is disposed in the first space S1 extending in the X direction between the group of capacitors 14A to 14F in the first row and the group of capacitors 14G to 14M in the second row. According to such a configuration, a tool such as a soldering iron may be easily brought into close contact with both sides of the first jumper element 15A. Thus, it is possible to achieve further efficiency of a work of detaching the first jumper element 15A.

From another point of view, at least a part of the first jumper element 15A may be disposed between the group of capacitors 14 in the first row and the group of capacitors 14 in the second row. According to such a configuration, even in a configuration where the first jumper element 15A is provided, an increase of a size of the substrate 10 may be prevented.

In the first embodiment, for example, the maximum width h1 of the first jumper element 15A in the Y direction is narrower than the maximum width H1 of the first conductor portion 51 in the Y direction, and also narrower than the maximum width H2 of the second conductor portion 52 in the Y direction. According to such a configuration, the movement of heat from the first conductor portion 51 to the second conductor portion 52 can be further reduced. Accordingly, a further reduction in a temperature rise of the NANDs 13 can be achieved.

In the first embodiment, for example, the power supply pattern 42 includes the third conductor portion 53. Then, the second conductor portion 52 and the third conductor portion 53 may be separated from each other in the X direction, and may be electrically connected to each other by the second jumper element 15B. According to such a configuration, heat can be hardly conducted at a boundary portion between the second conductor portion 52 and the third conductor portion 53 as well as at a boundary portion between the first conductor portion 51 and the second conductor portion 52. As a result, a further reduction in a temperature rise of the NANDs 13 can be achieved.

In the first embodiment, for example, the substrate 10 includes the non-conductor portion 71 located between the first conductor portion 51 and the second conductor portion 52, and the non-conductor portion 73 located between the fourth conductor portion 54 and the fifth conductor portion 55. Then, at least a part of the non-conductor portion 71 and at least a part of the non-conductor portion 73 may overlap each other in the Z direction. According to such a configuration, a part of heat moving to the vicinity of a boundary portion between the first conductor portion 51 and the second conductor portion 52 can be prevented from moving to the second conductor portion 52 through the fourth conductor portion 54 or the fifth conductor portion 55. Accordingly, this makes it more difficult for heat to be conducted from the first conductor portion 51 to the second conductor portion 52, and thus a further reduction in a temperature rise of the NANDs 13 can be achieved.

In the first embodiment, for example, the substrate 10 has the vias 81 that electrically connect the first conductor portion 51 to the fourth conductor portion 54. According to such a configuration, even in a case where a resistance of either of the first and third jumper elements 15A and 15C is higher than a designed value due to a certain cause, the magnitude of a current flowing through the first conductor portion 51 and the magnitude of a current flowing through the fourth conductor portion 54 can be optimized according to a magnitude relationship of resistance of the first and third jumper elements 15A and 15C. Accordingly, the amount of a current flowing through the jumper element 15 having a high resistance can be reduced, thereby reducing the loss occurring in the first and third jumper elements 15A and 15C.

Second Embodiment

Next, the second embodiment will be described. The second embodiment is different from the first embodiment in a point that the vias 81 are provided but the vias 82 and 83 are not provided. Configurations other than those to be described below are the same as those in the first embodiment.

Figure 8A:
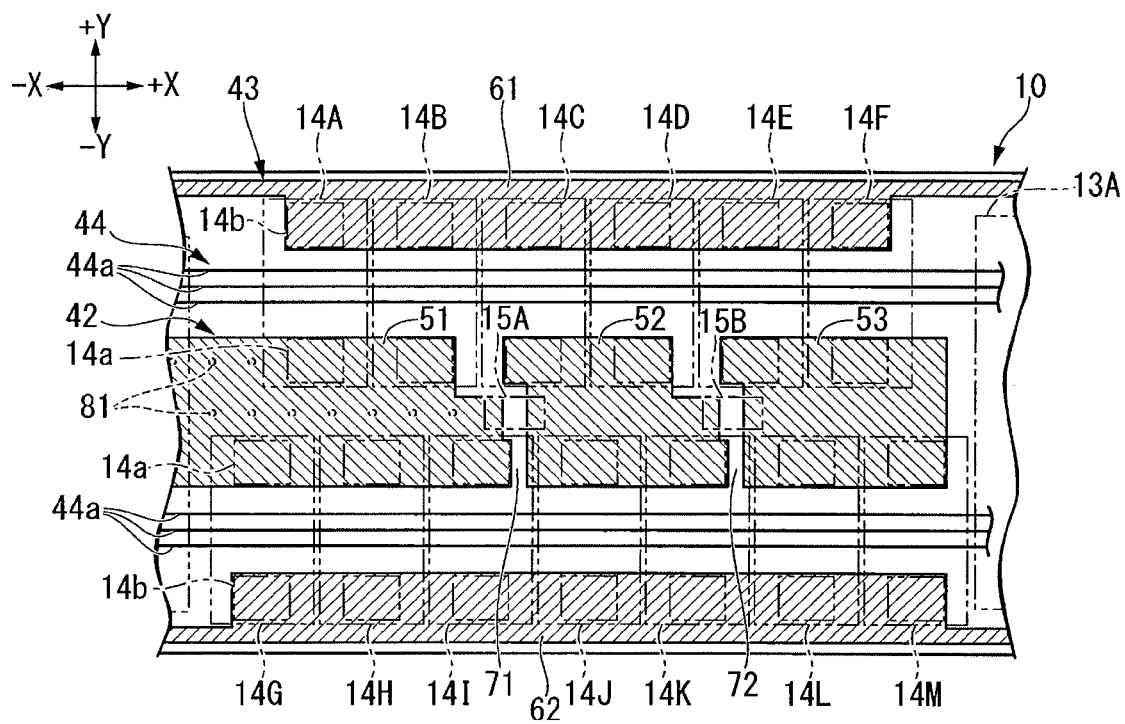
FIG. 8A is a plan view illustrating a part of a conductor pattern of a substrate at a first surface side in a second embodiment.
Figure 8B:
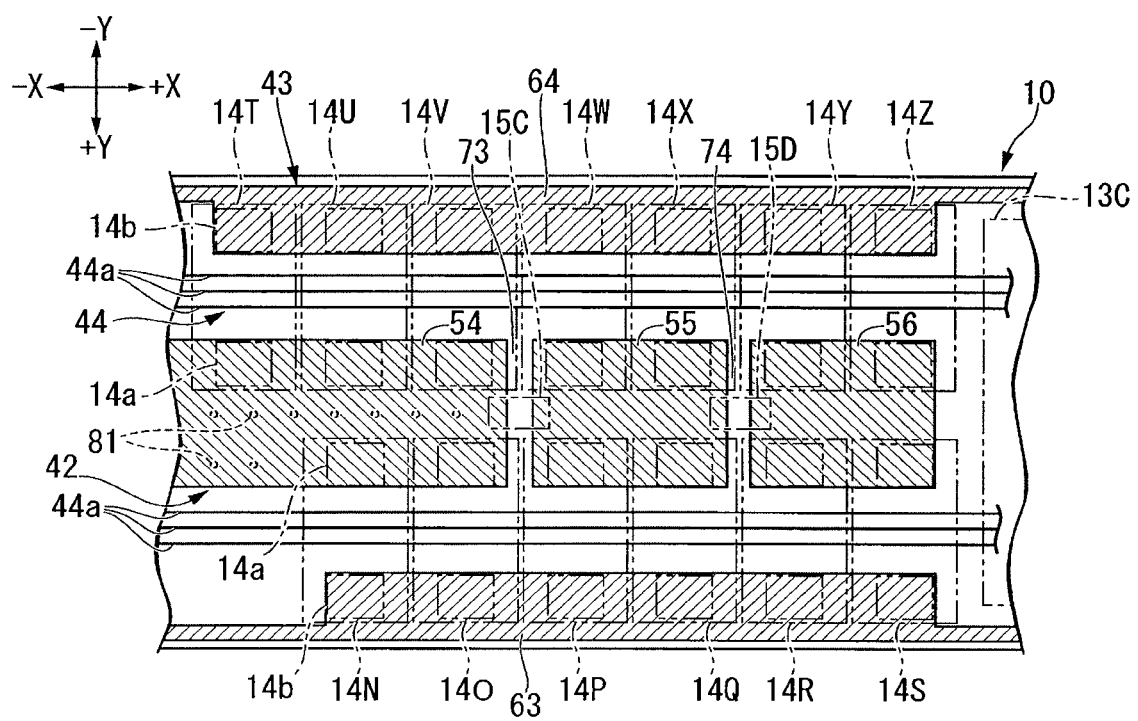
FIG. 8B is a plan view illustrating a part of a conductor pattern of the substrate at a second surface side in the second embodiment.

FIG. 8A is a plan view illustrating a part of the conductor pattern 22 of the substrate 10 at the first surface 10a side. FIG. 8B is a plan view illustrating a part of the conductor pattern 22 of the substrate 10 at the second surface 10b side. In the second embodiment, for example, the plurality of vias 81 are provided in a region overlapping the first conductor portion 51 and the fourth conductor portion 54 in the Z direction. Meanwhile, the vias 82 electrically connecting the second conductor portion 52 to the fifth conductor portion 55, and the vias 83 electrically connecting the third conductor portion 53 to the sixth conductor portion 56, are not provided. Thus, by detaching the first to fourth jumper elements 15A to 15D from the substrate 10, the second conductor portion 52 and the fifth conductor portion 55 are electrically insulated from each other, and the third conductor portion 53 and the sixth conductor portion 56 are electrically insulated from each other.

Figure 9:
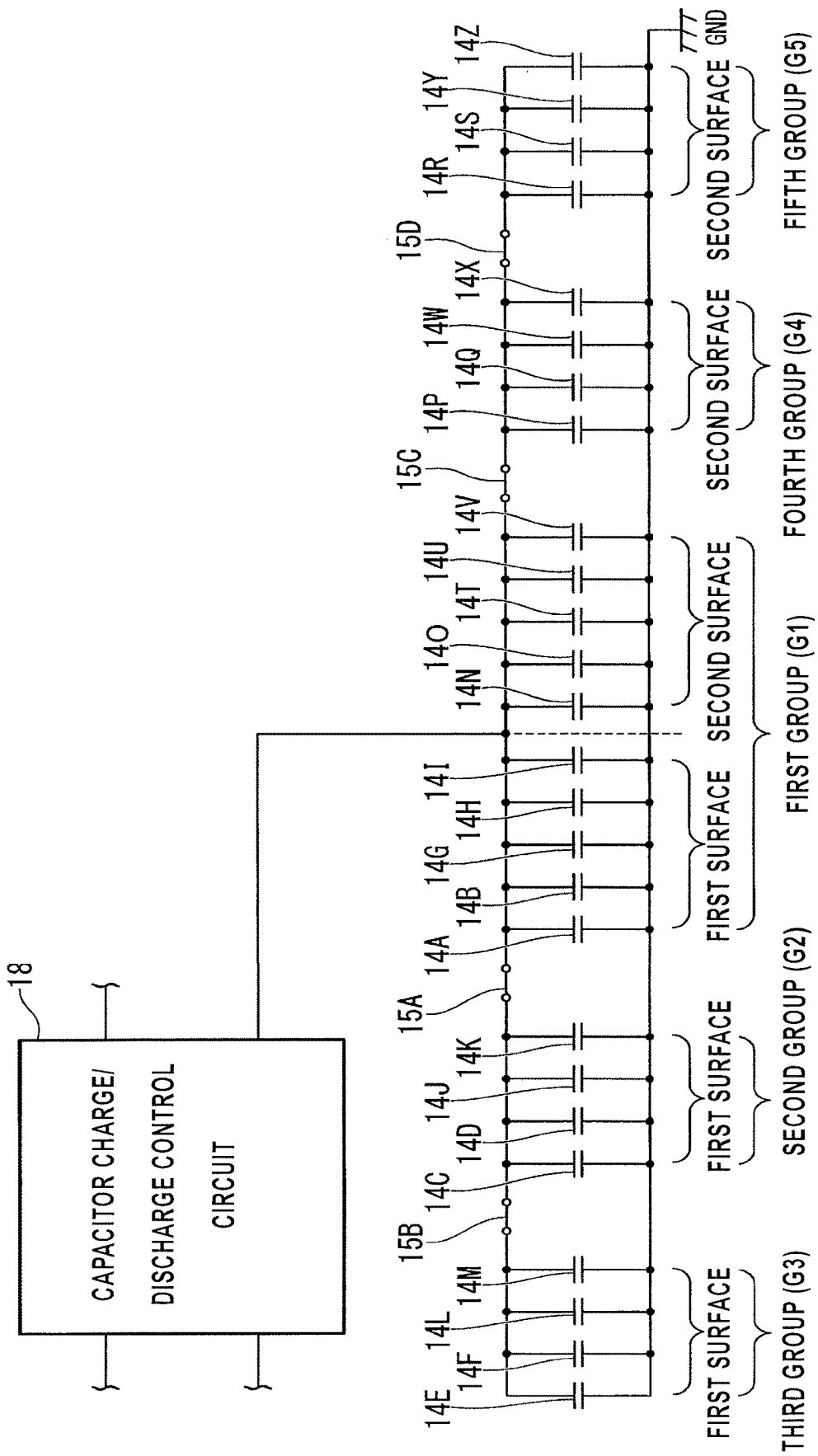
FIG. 9 is a view illustrating an electrical connection relationship among a plurality of capacitors in the second embodiment.

FIG. 9 is a view illustrating an electrical connection relationship among the plurality of capacitors 14 in the second embodiment. As illustrated in FIG. 9, the plurality of capacitors 14 are grouped into first to fifth groups G1 to G5. For example, the first group G1 includes the capacitors 14A, 14B, 14G, 14H, and 14I electrically connected to the first conductor portion 51, and the capacitors 14N, 14O, 14T, 14U, and 14V electrically connected to the fourth conductor portion 54. The second group G2, for example, includes the capacitors 14C, 14D, 14J, and 14K electrically connected to the second conductor portion 52. The third group G3, for example, includes the capacitors 14E, 14F, 14L, and 14M electrically connected to the third conductor portion 53. The fourth group G4, for example, includes the capacitors 14P, 14Q, 14W, and 14X electrically connected to the fifth conductor portion 55. The fifth group G5, for example, includes the capacitors 14R, 14S, 14Y, and 14Z electrically connected to the sixth conductor portion 56.

As illustrated in FIG. 9, the plurality of capacitors 14 in the first group G1 and the plurality of capacitors 14 in the second group G2 may be electrically connected to each other through the first jumper element 15A. The plurality of capacitors 14 in the second group G2 and the plurality of capacitors 14 in the third group G3 may be electrically connected to each other through the second jumper element 15B. The plurality of capacitors 14 in the first group G1 and the plurality of capacitors 14 in the fourth group G4 may be electrically connected to each other through the third jumper element 15C. The plurality of capacitors 14 in the fourth group G4 and the plurality of capacitors 14 in the fifth group G5 may be electrically connected to each other through the fourth jumper element 15D. By detaching the first to fourth jumper elements 15A to 15D from the substrate 10, the first to fifth groups G1 to G5 may be electrically insulated from each other.

According to such a configuration, when a failure occurs in the capacitors 14, it is possible to group the plurality of capacitors 14 into five groups G1 to G5 by detaching the first to fourth jumper elements 15A to 15D from the substrate 10. Accordingly, it is possible to more finely determine a group including the failed capacitor 14. As a result, further efficiency of a failure analysis may be achieved.

Third Embodiment

Next, the third embodiment will be described. The embodiment is different from the first embodiment in a point that the sixth conductor portion 56 is electrically connected to the fourth conductor portion 54 through one jumper element 15D. Configurations other than those to be described below are the same as those in the first embodiment.

Figure 10A:
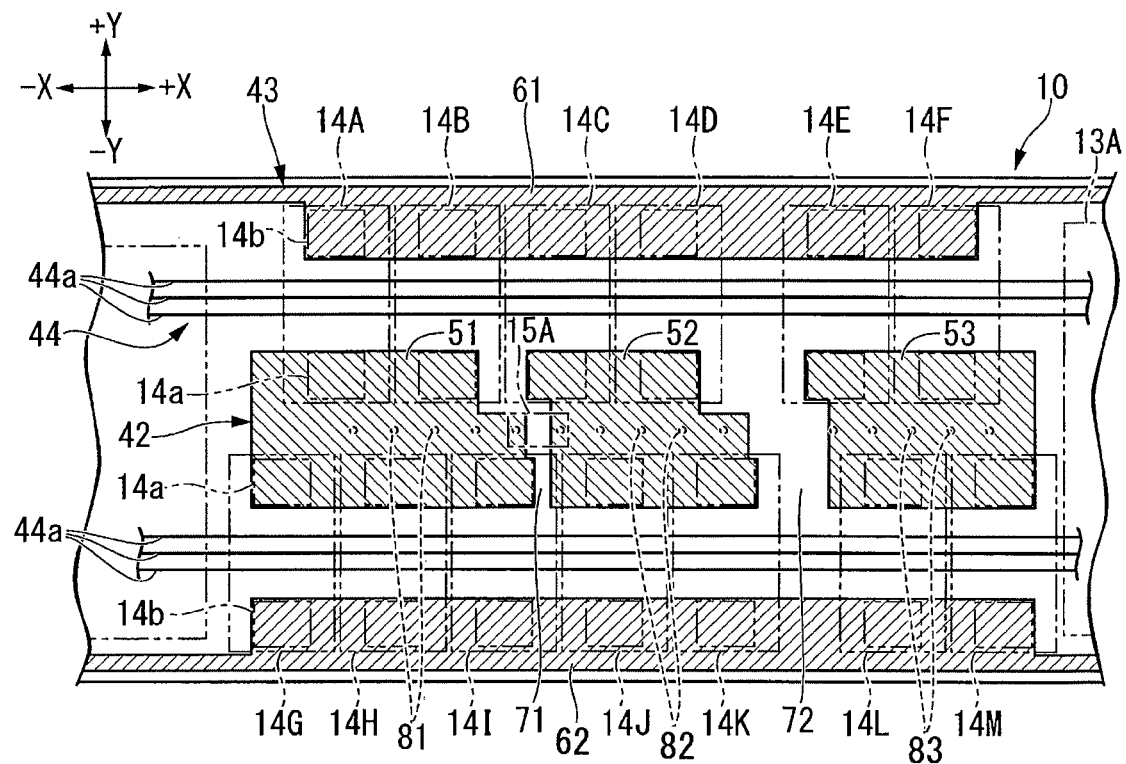
FIG. 10A is a plan view illustrating a part of a conductor pattern of a substrate at a first surface side in a third embodiment.
Figure 10B:
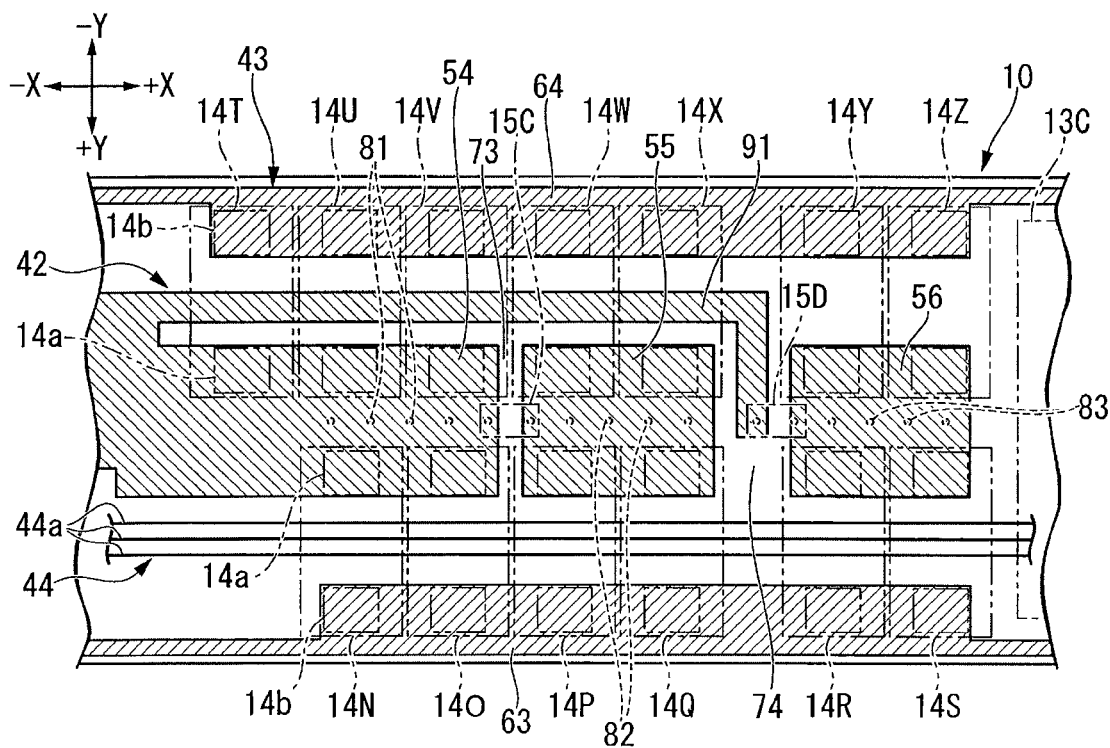
FIG. 10B is a plan view illustrating a part of a conductor pattern of the substrate at a second surface side in the third embodiment.

FIG. 10A is a plan view illustrating a part of the conductor pattern 22 of the substrate 10 at the first surface 10a side. FIG. 10B is a plan view illustrating a part of the conductor pattern 22 of the substrate 10 at the second surface 10b side. In the third embodiment, for example, the power supply pattern 42 includes an extension portion 91 diverging from the fourth conductor portion 54. The extension portion 91 may extend to the vicinity of the sixth conductor portion 56.

In the third embodiment, for example, the first terminal 15a of the fourth jumper element 15D is fixed to the surface of the extension portion 91 by solder Q. Accordingly, the sixth conductor portion 56 can be electrically connected to the fourth conductor portion 54 through the fourth jumper element 15D and the extension portion 91. That is, the sixth conductor portion 56 can be electrically connected to the fourth conductor portion 54 without interposing the fifth conductor portion 55 and the third jumper element 15C can be connected therebetween.

Figure 11:
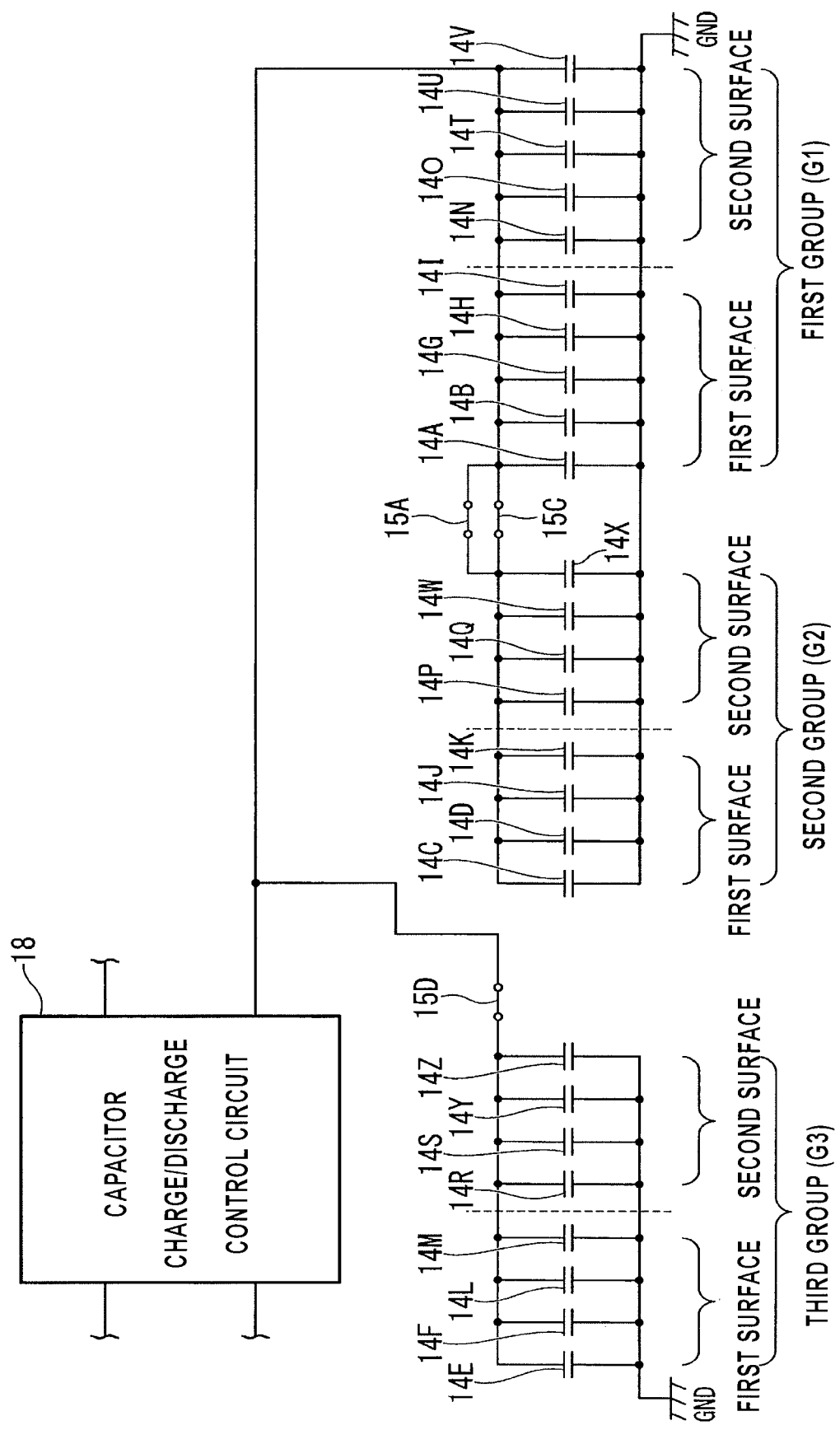
FIG. 11 is a view illustrating an electrical connection relationship among a plurality of capacitors in the third embodiment.

FIG. 11 is a view illustrating an electrical connection relationship among the plurality of capacitors 14 in the third embodiment. As illustrated in FIG. 11, the plurality of capacitors 14 are grouped into the first to third groups G1 to G3 similar to the first embodiment. In the third embodiment, for example, the plurality of capacitors 14 in the first group G1 and the plurality of capacitors 14 in the third group G3 are electrically connected to each other through the fourth jumper element 15D.

Here, the resistance of the jumper element 15 is sufficiently low but is not completely zero. In the configuration of the first embodiment, the third conductor portion 53 may be electrically connected to the first conductor portion 51 through the two jumper elements 15A and 15B. Likewise, in the third embodiment, the sixth conductor portion 56 may be electrically connected to the fourth conductor portion 54 through the two jumper elements 15C and 15D. Thus, the current flowing through the power supply pattern 42 may be slightly lost while flowing through the two jumper elements 15A and 15B, or the two jumper elements 15C and 15D.

Meanwhile, in the third embodiment, for example, the sixth conductor portion 56 is electrically connected to the fourth conductor portion 54 through one jumper element 15D. According to such a configuration, it is possible to reduce the number of jumper elements 15 through which a current flows, thereby reducing a loss.

Fourth Embodiment

Next, the fourth embodiment will be described. The fourth embodiment is different from the first embodiment in a point that the ground pattern 43 includes a plurality of conductor portions 101 to 106 separated from each other in the X direction. Configurations other than those to be described below are the same as those in the first embodiment.

Figure 12A:
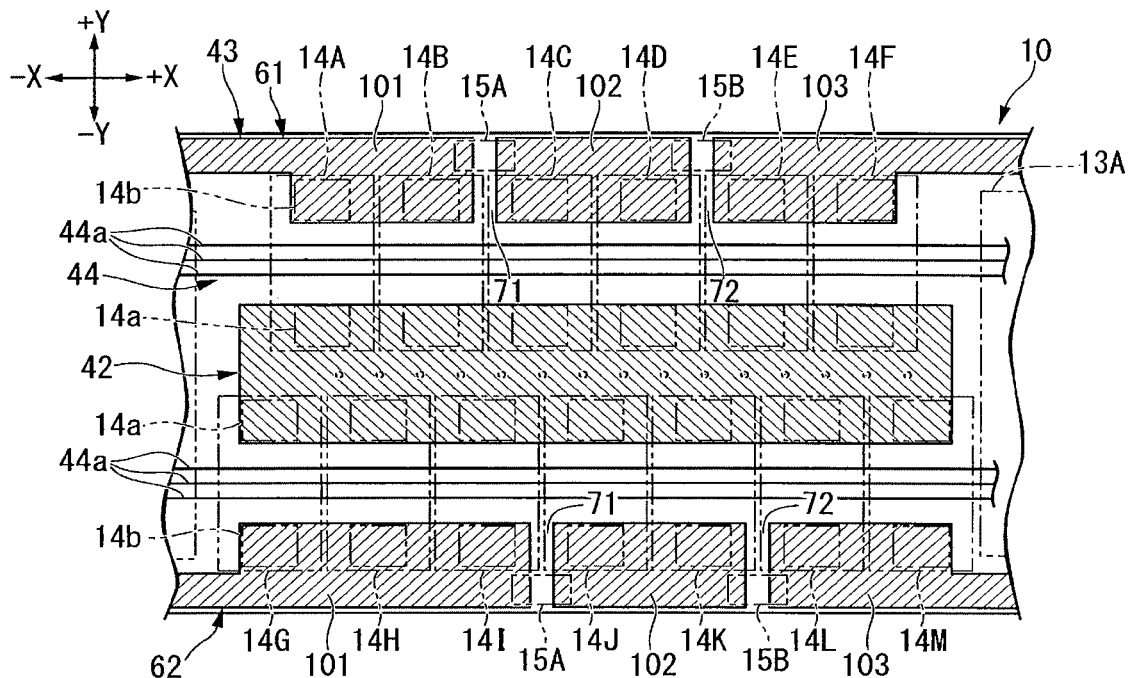
FIG. 12A is a plan view illustrating a part of a conductor pattern of a substrate at a first surface side in a fourth embodiment.
Figure 12B:
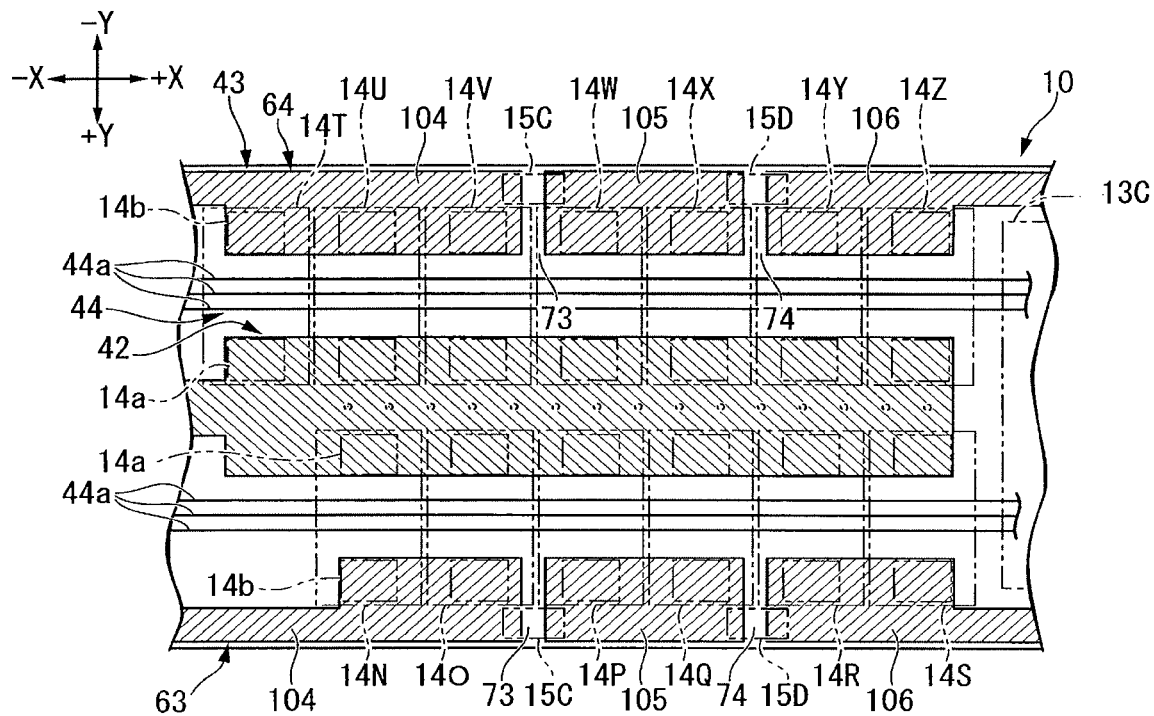
FIG. 12B is a plan view illustrating a part of a conductor pattern of the substrate at a second surface side in the fourth embodiment.

FIG. 12A is a plan view illustrating a part of the conductor pattern 22 of the substrate 10 at the first surface 10a side. FIG. 12B is a plan view illustrating a part of the conductor pattern 22 of the substrate 10 at the second surface 10b side. In the fourth embodiment, for example, each of the first and second ground portions 61 and 62 includes the first to third conductor portions 101 to 103. The first to third conductor portions 101 to 103 may be provided in the third region 33 of the substrate 10. The first to third conductor portions 101 to 103 may be aligned in the X direction. The third conductor portion 103 may be located opposite to the first conductor portion 101 with respect to the second conductor portion 102.

In explaining the first ground portion 61, the first conductor portion 101 may overlap the negative electrode terminals 14b of the capacitors 14A and 14B in the first row in the Z direction. For example, the negative electrode terminals 14b of the capacitors 14A and 14B in the first row may be fixed to the surface of the first conductor portion 101 by soldering, for example. Accordingly, the first conductor portion 101 can be electrically connected to the capacitors 14A and 14B in the first row. Likewise, the second conductor portion 102 may overlap the negative electrode terminals 14b of the capacitors 14C and 14D in the first row in the Z direction. For example, the negative electrode terminals 14b of the capacitors 14C and 14D in the first row may be fixed to the surface of the second conductor portion 102 by soldering, for example. Accordingly, the second conductor portion 102 can be electrically connected to the capacitors 14C and 14D in the first row. The third conductor portion 103 may overlap the negative electrode terminals 14b of the capacitors 14E and 14F in the first row in the Z direction. For example, the negative electrode terminals 14b of the capacitors 14E and 14F in the first row may be fixed to the surface of the third conductor portion 103 by soldering, for example. Accordingly, the third conductor portion 103 can be electrically connected to the capacitors 14E and 14F in the first row.

In explaining the first ground portion 62, the first conductor portion 101 may overlap the negative electrode terminals 14b of the capacitors 14G, 14H, and 14I in the second row in the Z direction. For example, the negative electrode terminals 14b of the capacitors 14G, 14H, and 14I in the second row may be fixed to the surface of the first conductor portion 101 by soldering, for example. Accordingly, the first conductor portion 101 can be electrically connected to the capacitors 14G, 14H, and 14I in the second row. Likewise, the second conductor portion 102 may overlap the negative electrode terminals 14b of the capacitors 14J and 14K in the second row in the Z direction. For example, the negative electrode terminals 14b of the capacitors 14J and 14K in the second row may be fixed to the surface of the second conductor portion 102 by soldering, for example. Accordingly, the second conductor portion 102 can be electrically connected to the capacitors 14J and 14K in the second row. The third conductor portion 103 may overlap the negative electrode terminals 14b of the capacitors 14L and 14M in the second row in the Z direction. For example, the negative electrode terminals 14b of the capacitors 14L and 14M in the second row may be fixed to the surface of the third conductor portion 103 by soldering, for example. Accordingly, the third conductor portion 103 can be electrically connected to the capacitors 14L and 14M in the second row.

As illustrated in FIG. 12B, in the fourth embodiment, each of the third and fourth ground portions 63 and 64 includes the fourth to sixth conductor portions 104 to 106. The fourth to sixth conductor portions 104 to 106 may be provided in the third region 33 of the substrate 10. The fourth to sixth conductor portions 104 to 106 may be aligned in the X direction. The sixth conductor portion 106 may be located opposite to the fourth conductor portion 104 with respect to the fifth conductor portion 105.

Description on the third ground portion 63 is made by replacing "the capacitors 14A and 14B in the first row" by "the capacitors 14N and 14O in the third row," "the capacitors 14C and 14D in the first row" by "the capacitors 14P and 14Q in the third row," and "the capacitors 14E and 14F in the first row" by "the capacitors 14R and 14S in the third row" in the above description on the first ground portion 61. Description on the fourth ground portion 64 is made by replacing "the capacitors 14G, 14H, and 14I in the second row" by "the capacitors 14T, 14U, and 14V in the fourth row," "the capacitors 14J and 14K in the second row" by "the capacitors 14W and 14X in the fourth row," and "the capacitors 14L and 14M in the second row" by "the capacitors 14Y and 14Z in the fourth row" in the above description on the second ground portion 62.

In the fourth embodiment, for example, the first conductor portion 101 and the second conductor portion 102 are electrically connected to each other by the first jumper element 15A. The second conductor portion 102 and the third conductor portion 103 may be electrically connected to each other by the second jumper element 15B. The fourth conductor portion 104 and the fifth conductor portion 105 may be electrically connected to each other by the third jumper element 15C. The fifth conductor portion 105 and the sixth conductor portion 106 may be electrically connected to each other by the fourth jumper element 15D.

In the fourth embodiment, for example, the power supply pattern 42 is not separated into a plurality of conductor portions in the X direction, but continuously extends in a region where all the capacitors 14 are mounted. However, as in the first embodiment, the power supply pattern 42 may be separated into the plurality of conductor portions 51 to 56 in the X direction, and the conductor portions 51 to 56 may be electrically connected to each other by the jumper elements 15.

According to such a configuration, for the same reason as those for the first embodiment, heat can be hardly conducted from the controller 11 to the NANDs 13. Accordingly, the reliability of the semiconductor memory device 1 can be improved. According to the configuration of the fourth embodiment, it is possible to determine a group including a failed capacitor 14 among the first to third groups G1 to G3 by detaching the first to fourth jumper elements 15A to 15D from the substrate 10. Accordingly, efficiency of a failure analysis can be achieved.

Fifth Embodiment

Next, the fifth embodiment will be described. The fifth embodiment is different from the first embodiment in a point that the plurality of conductor portions 51 to 56 are connected to each other by connection portions 111 to 114 as a part of the conductor pattern 22, instead of the jumper elements 15A to 15D. Configurations other than those to be described below are the same as those in the first embodiment.

Figure 13A:
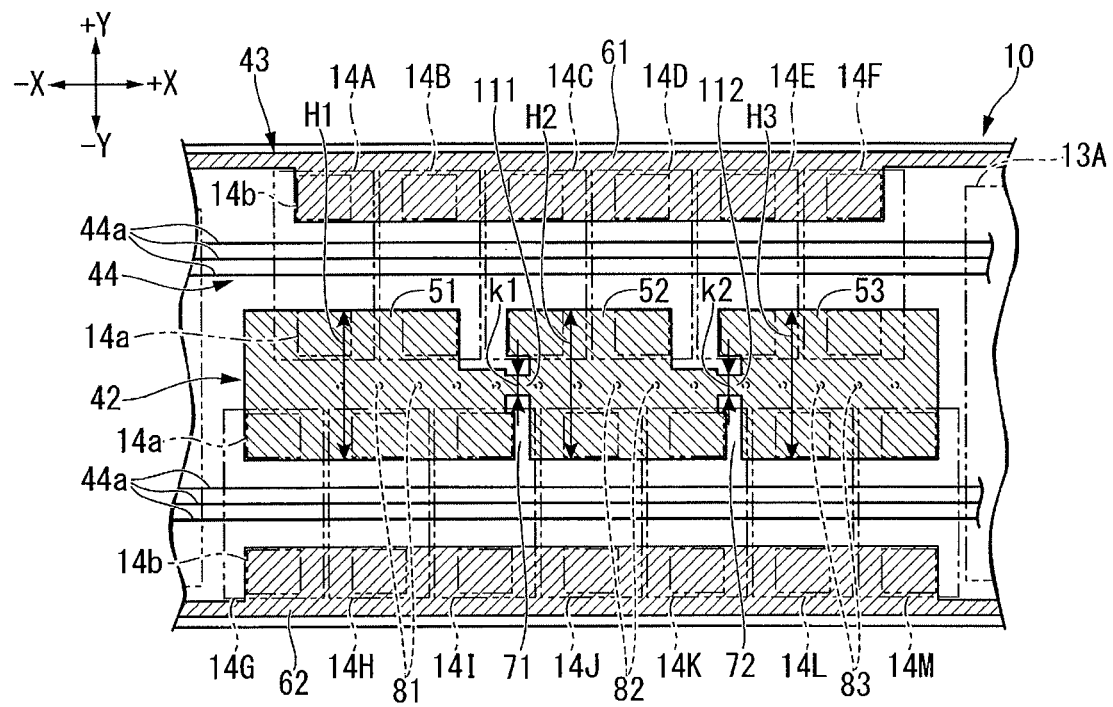
FIG. 13A is a plan view illustrating a part of a conductor pattern of a substrate at a first surface side in a fifth embodiment.
Figure 13B:
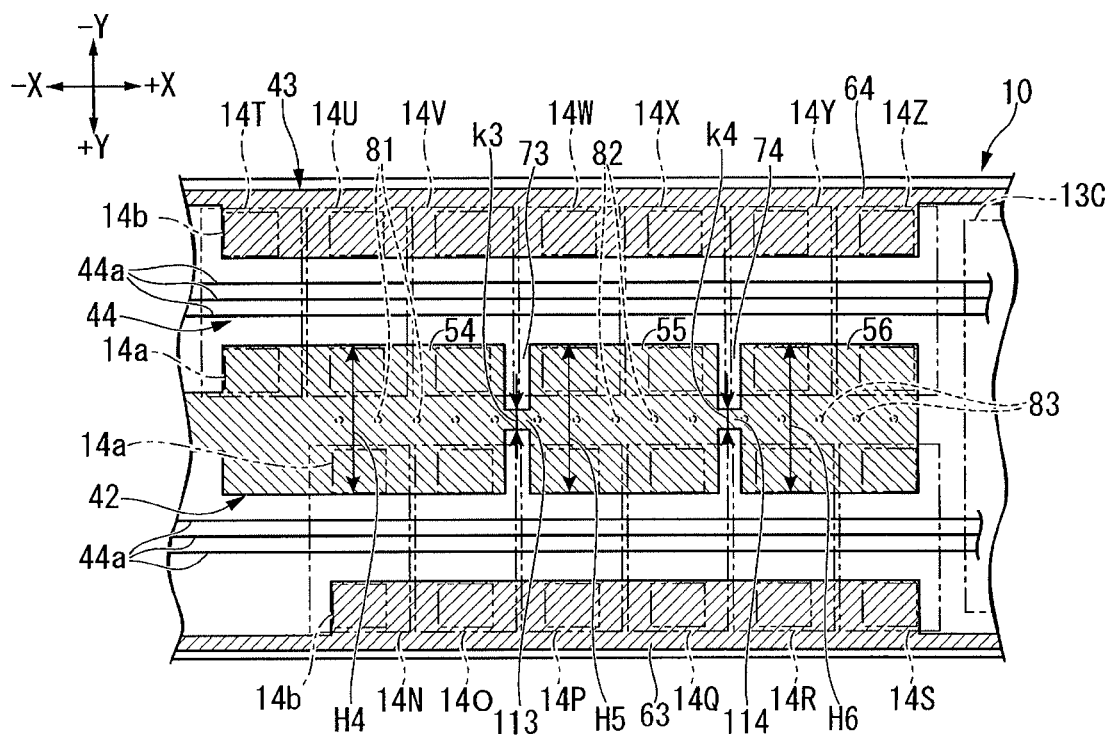
FIG. 13B is a plan view illustrating a part of a conductor pattern of the substrate at a second surface side in the fifth embodiment.

FIG. 13A is a plan view illustrating a part of the conductor pattern 22 of the substrate 10 at the first surface 10a side. FIG. 13B is a plan view illustrating a part of the conductor pattern 22 of the substrate 10 at the second surface 10b side. In the fifth embodiment, for example, the first to fourth jumper elements 15A to 15D are not provided. In the fifth embodiment, the power supply pattern 42 may have first to fourth connection portions 111 to 114. The first and second connection portions 111 and 112 may be formed through, for example, the same manufacturing process as the first to third conductor portions 51 to 53. The third and fourth connection portions 113 and 114 may be formed through, for example, the same manufacturing process as the fourth to sixth conductor portions 54 to 56.

The first connection portion 111 may be provided on a surface layer in the substrate 10 at the first surface 10a side. The first connection portion 111 may be located between the first conductor portion 51 and the second conductor portion 52 to connect the first conductor portion 51 to the second conductor portion 52. Accordingly, the first conductor portion 51 and the second conductor portion 52 can be electrically connected to each other by the first connection portion 111. A maximum width k1 of the first connection portion 111 in the Y direction may be narrower than the maximum width H1 of the first conductor portion 51 in the Y direction and also may be narrower than the maximum width H2 of the second conductor portion 52 in the Y direction.

The second connection portion 112 may be provided on a surface layer in the substrate 10 at the first surface 10a side. The second connection portion 112 may be located between the second conductor portion 52 and the third conductor portion 53 to connect the second conductor portion 52 to the third conductor portion 53. Accordingly, the second conductor portion 52 and the third conductor portion 53 can be electrically connected to each other by the second connection portion 112. A maximum width k2 of the second connection portion 112 in the Y direction may be narrower than the maximum width H2 of the second conductor portion 52 in the Y direction, and also may be narrower than the maximum width H3 of the third conductor portion 53 in the Y direction.

The third connection portion 113 may be provided on a surface layer in the substrate 10 at the second surface 10b side. The third connection portion 113 may be located between the fourth conductor portion 54 and the fifth conductor portion 55 to connect the fourth conductor portion 54 to the fifth conductor portion 55. Accordingly, the fourth conductor portion 54 and the fifth conductor portion 55 can be electrically connected to each other by the third connection portion 113. A maximum width k3 of the third connection portion 113 in the Y direction may be narrower than the maximum width H4 of the fourth conductor portion 54 in the Y direction, and also may be narrower than the maximum width H5 of the fifth conductor portion 55 in the Y direction.

The fourth connection portion 114 may be provided on a surface layer in the substrate 10 at the second surface 10b side. The fourth connection portion 114 may be located between the fifth conductor portion 55 and the sixth conductor portion 56 to connect the fifth conductor portion 55 to the sixth conductor portion 56. Accordingly, the fifth conductor portion and the sixth conductor portion 56 can be electrically connected to each other by the fourth connection portion 114. A maximum width k4 of the fourth connection portion 114 in the Y direction may be narrower than the maximum width H5 of the fifth conductor portion 55 in the Y direction, and also may be narrower than the maximum width H6 of the sixth conductor portion 56 in the Y direction.

According to such a configuration, for the same reason for the first embodiment, heat can be hardly conducted from the controller 11 to the NANDs 13. Accordingly, the reliability of the semiconductor memory device 1 can be improved.

Several embodiments have been described above. Meanwhile, the embodiments are not limited to the above described examples. For example, the above described embodiments may be implemented by combining with each other. The number of the NANDs 13, the type and number of the capacitors 14, the type and number of the jumper elements 15 and the like are not limited to the above described examples. The power supply pattern 42 may not be provided on the surface layer of the substrate 10 but may be provided in the inner layer of the substrate 10. In this case, a pad electrically connected to the power supply pattern 42 may be provided on the surface layer of the substrate 10, and the capacitor 14 may be fixed to the pad by soldering. In this case, the pad may correspond to a part of the conductor pattern 22. The terms such as "first" and "second" affixed to the name of each member in the embodiments are attached for convenience of explanation, and may be properly reattached.

According to at least one of the above described embodiments, a conductor pattern may have a plurality of separate conductor portions, and thus the reliability may be improved.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor memory device comprising:
a substrate having a first region, a second region, and a third region located between the first region and the second region, the substrate having a conductor pattern;
a controller mounted in the first region;
a semiconductor memory component mounted in the second region and configured to be controlled by the controller;
a first capacitor and a second capacitor, mounted in the third region on a first surface and aligned in a first direction from the first region toward the second region;
a first jumper element mounted in the third region; and
a third capacitor and a fourth capacitor, mounted in the third region on a second surface located opposite to the first surface,
wherein the conductor pattern includes a first conductor portion that overlaps a part of the first capacitor in a thickness direction of the substrate and is electrically connected to the first capacitor, and a second conductor portion that overlaps a part of the second capacitor in the thickness direction of the substrate and is electrically connected to the second capacitor,
the first conductor portion and the second conductor portion are separated from each other in the first direction, and are electrically connected to each other by the first jumper element,
the conductor pattern further includes a third conductor portion and a fourth conductor portion provided at different locations from the first and second conductor portions, respectively, in the thickness direction of the substrate, the third conductor portion overlapping a part of the third capacitor in the thickness direction of the substrate and being electrically connected to the third capacitor, the fourth conductor portion overlapping a part of the fourth capacitor in the thickness direction of the substrate and being electrically connected to the fourth capacitor, and the third conductor portion and the fourth conductor portion are separated from each other in the first direction, and
the substrate further has a first via extending in the thickness direction of the substrate to electrically connect the first conductor portion to the third conductor portion and a second via extending in the thickness direction of the substrate to electrically connect the second conductor portion to the fourth conductor portion.

2. The semiconductor memory device according to claim 1, wherein the first jumper element is fixed to the substrate using solder, and is configured to be detachable from the substrate in response to the solder being melted.

3. The semiconductor memory device according to claim 1, wherein a maximum width of the first jumper element in a second direction intersecting the first direction is narrower than a maximum width of the first conductor portion in the second direction, and also narrower than a maximum width of the second conductor portion in the second direction.

4. The semiconductor memory device according to claim 1, further comprising a fifth capacitor aligned with the first capacitor in a second direction intersecting the first direction,
wherein the first conductor portion is electrically connected to the fifth capacitor, extending over a region overlapping a part of the first capacitor in the thickness direction of the substrate, and over a region overlapping a part of the fifth capacitor in the thickness direction of the substrate, in the substrate.

5. The semiconductor memory device according to claim 4, wherein a part of the first jumper element is disposed between the first capacitor and the fifth capacitor.

6. The semiconductor memory device according to claim 5, further comprising a sixth capacitor aligned with the second capacitor in the second direction,
wherein the second conductor portion is electrically connected to the sixth capacitor, extending over a region overlapping a part of the second capacitor in the thickness direction of the substrate, and over a region overlapping a part of the sixth capacitor in the thickness direction of the substrate, in the substrate.

7. The semiconductor memory device according to claim 6, wherein another part of the first jumper element is disposed between the second capacitor and the sixth capacitor.

8. The semiconductor memory device according to claim 1, further comprising:
a seventh capacitor mounted in the third region and disposed opposite to the first capacitor with respect to the second capacitor in the first direction; and
a second jumper element mounted in the third region,
wherein the conductor pattern further includes a fifth conductor portion that overlaps a part of the seventh capacitor in the thickness direction of the substrate and is electrically connected to the seventh capacitor,
wherein the second conductor portion and the fifth conductor portion are separated from each other in the first direction, and are electrically connected to each other by the second jumper element.

9. The semiconductor memory device according to claim 1, further comprising:
a third jumper element mounted in the third region on the second surface,
wherein the third conductor portion and the fourth conductor portion are electrically connected to each other by the third jumper element.

10. The semiconductor memory device according to claim 9,
wherein the substrate includes a first non-conductor portion located between the first conductor portion and the second conductor portion, and a second non-conductor portion located between the third conductor portion and the fourth conductor portion, and
a part of the first non-conductor portion and a part of the second non-conductor portion overlap each other in the thickness direction of the substrate.

11. The semiconductor memory device according to claim 9, wherein a part of the first jumper element and a part of the third jumper element overlap each other in the thickness direction of the substrate.

12. A semiconductor memory device comprising:
a substrate having a first region, a second region, and a third region located between the first region and the second region, the substrate having a conductor pattern;
a controller mounted in the first region;
a semiconductor memory component mounted in the second region and configured to be controlled by the controller;
first and second capacitors mounted in the third region on a first surface, and aligned in a first direction from the first region toward the second region;
a first jumper element mounted in the third region; and a third capacitor and a fourth capacitor, mounted in the third region on a second surface located opposite to the first surface, wherein the conductor pattern includes a first conductor portion electrically connected to the first capacitor, and a second conductor portion electrically connected to the second capacitor, and the first conductor portion and the second conductor portion are separated from each other in the first direction, and are electrically connected to each other by the first jumper element, the conductor pattern further includes a third conductor portion and a fourth conductor portion provided at different locations from the first and second conductor portions, respectively, in the thickness direction of the substrate, the third conductor portion overlapping a part of the third capacitor in the thickness direction of the substrate and being electrically connected to the third capacitor, and the fourth conductor portion overlapping a part of the fourth capacitor in the thickness direction of the substrate and being electrically connected to the fourth capacitor, the third conductor portion and the fourth conductor portion are separated from each other in the first direction, and the substrate further has a first via extending in the thickness direction of the substrate to electrically connect the first conductor portion to the third conductor portion and a second via extending in the thickness direction of the substrate to electrically connect the second conductor portion to the fourth conductor portion.

* * * * *